(12) United States Patent
Ikeda et al.

(10) Patent No.: US 11,664,356 B2
(45) Date of Patent: May 30, 2023

(54) LIGHT EMITTING DEVICE

(71) Applicant: NICHIA CORPORATION, Anan (JP)

(72) Inventors: Tadaaki Ikeda, Anan (JP); Yuki Kageyama, Tokushima (JP); Tetsuya Ishikawa, Komatsushima (JP); Toshifumi Imura, Anan (JP)

(73) Assignee: NICHIA CORPORATION, Anan (JP)

( * ) Notice: Subject to any disclaimer, the term of this patent is extended or adjusted under 35 U.S.C. 154(b) by 145 days.

(21) Appl. No.: 17/209,015

(22) Filed: Mar. 22, 2021

(65) Prior Publication Data

US 2021/0305218 A1  Sep. 30, 2021

(30) Foreign Application Priority Data

Mar. 26, 2020  (JP) .............................. JP2020-056911
Sep. 11, 2020  (JP) .............................. JP2020-152787

(51) Int. Cl.
*H01L 25/075*  (2006.01)
*H01L 33/58*  (2010.01)
(Continued)

(52) U.S. Cl.
CPC .......... *H01L 25/0753* (2013.01); *H01L 33/54* (2013.01); *H01L 33/58* (2013.01);
(Continued)

(58) Field of Classification Search
CPC ..... H01L 25/0753; H01L 33/54; H01L 33/58; H01L 33/502; H01L 33/505; H01L 2933/0091; G02B 6/0073
See application file for complete search history.

(56) References Cited

U.S. PATENT DOCUMENTS

2004/0046242 A1  3/2004 Asakawa
2010/0085772 A1  4/2010 Song et al.
(Continued)

FOREIGN PATENT DOCUMENTS

JP  2004363537 A  12/2004
JP  2010093226 A  4/2010
(Continued)

*Primary Examiner* — Mary Ellen Bowman
(74) *Attorney, Agent, or Firm* — Global IP Counselors, LLP

(57) ABSTRACT

A light emitting device includes light emitting elements, light-transmissive members, a covering member, at least one first protrusion, and two second protrusions. The light emitting elements are aligned in a first direction. The light-transmissive members are respectively disposed on upper surfaces of the light emitting elements. The covering member includes at least one first covering portion and two second covering portions. The at least one first covering portion is arranged between adjacent ones of the light-transmissive members, and the second covering portions are arranged at distal ends of the light emitting device in the first direction with the light-transmissive members being arranged between the second covering portions. The at least one first protrusion is arranged on an upper surface of the at least one first covering portion and being spaced apart from the light-transmissive members. The second protrusions respectively arranged on upper surfaces of the second covering portions.

26 Claims, 15 Drawing Sheets

(51) Int. Cl.
  *H01L 33/54* (2010.01)
  *F21V 8/00* (2006.01)
  *H01L 33/50* (2010.01)

(52) U.S. Cl.
  CPC .......... *G02B 6/0073* (2013.01); *H01L 33/502* (2013.01); *H01L 33/505* (2013.01); *H01L 2933/0091* (2013.01)

(56) References Cited

U.S. PATENT DOCUMENTS

| | | |
|---|---|---|
| 2013/0070479 A1 | 3/2013 | Ito |
| 2014/0284652 A1 | 9/2014 | Shimada et al. |
| 2015/0009714 A1 | 1/2015 | Okano et al. |
| 2015/0162509 A1 | 6/2015 | Kuramoto et al. |
| 2015/0295153 A1 | 10/2015 | Kuramoto et al. |
| 2016/0254425 A1 | 9/2016 | Chung et al. |
| 2016/0268471 A1 | 9/2016 | Endo et al. |
| 2016/0343918 A1 | 11/2016 | Yamada et al. |
| 2018/0315897 A1 | 11/2018 | Nakabayashi et al. |
| 2020/0182424 A1 | 6/2020 | Yuge et al. |

FOREIGN PATENT DOCUMENTS

| | | | | |
|---|---|---|---|---|
| JP | 2013069423 A | * | 4/2013 | ........... G02B 6/0031 |
| JP | 2013069423 A | | 4/2013 | |
| JP | 2013125883 A | | 6/2013 | |
| JP | 2013168685 A | | 8/2013 | |
| JP | 2013187222 A | | 9/2013 | |
| JP | 2013219260 A | | 10/2013 | |
| JP | 2014041985 A | | 3/2014 | |
| JP | 2014042074 A | | 3/2014 | |
| JP | 2014072213 A | | 4/2014 | |
| JP | 2014187319 A | | 10/2014 | |
| JP | 2015109354 A | | 6/2015 | |
| JP | 2015213157 A | | 11/2015 | |
| JP | 2016058689 A | | 4/2016 | |
| JP | 2016171188 A | | 9/2016 | |
| JP | 2016219613 A | | 12/2016 | |
| JP | 2016537810 A | | 12/2016 | |
| JP | 2018060989 A | | 4/2018 | |
| JP | 2019016766 A | | 1/2019 | |
| JP | 2020053642 A | | 4/2020 | |
| WO | 2013121834 A1 | | 8/2013 | |
| WO | 2016038757 A1 | | 3/2016 | |
| WO | 2019064980 A1 | | 4/2019 | |

* cited by examiner

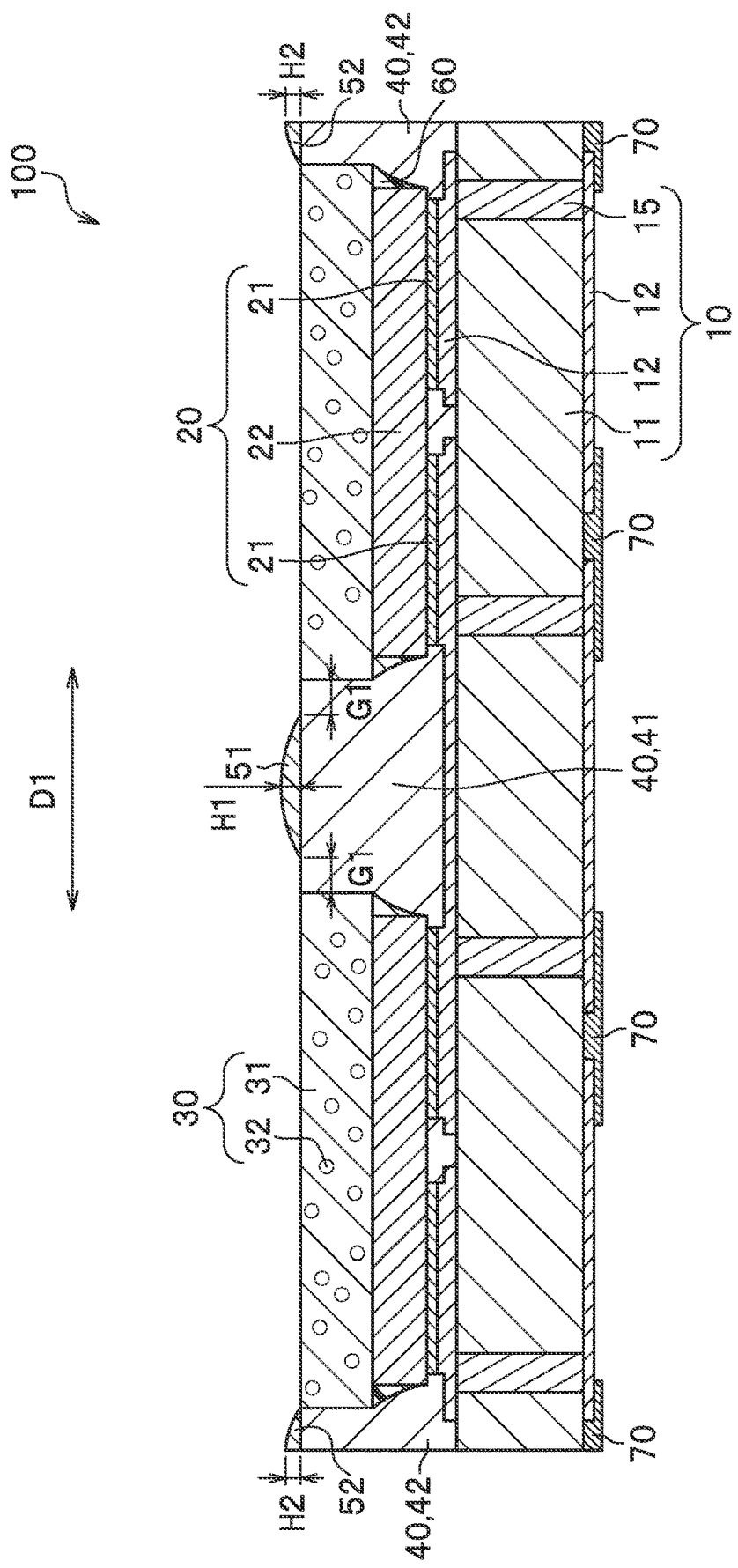

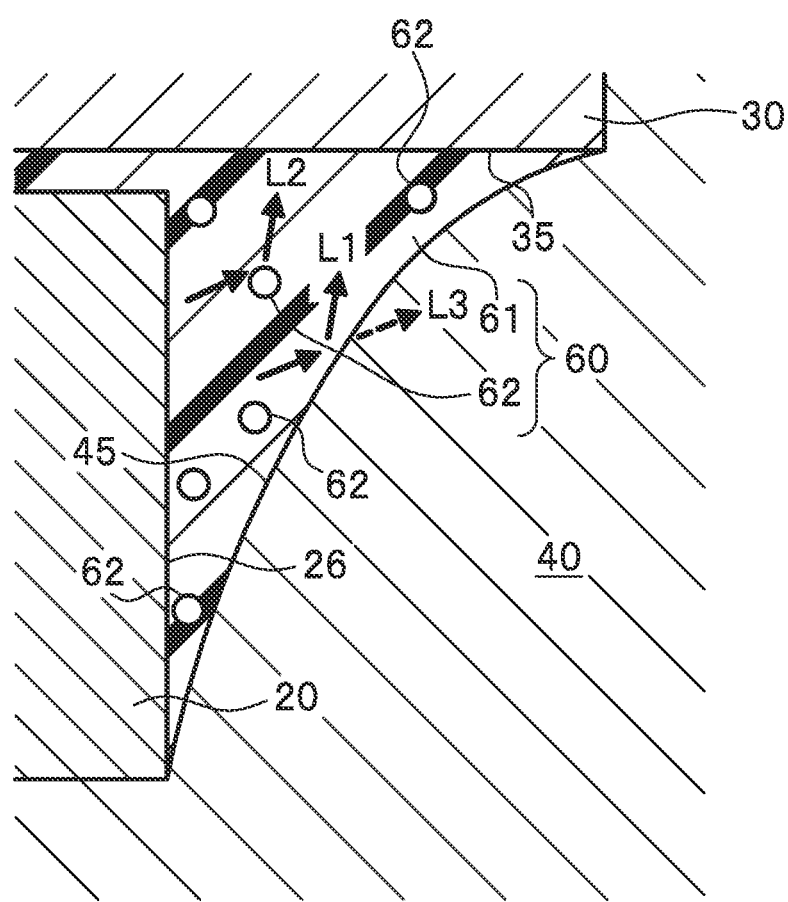

US 11,664,356 B2

LIGHT EMITTING DEVICE

CROSS-REFERENCE TO RELATED PATENT APPLICATION

The present application claims priority under 35 U. S. C. § 119 to Japanese Patent Application No. 2020-056911, filed on Mar. 26, 2020 and Japanese Patent Application No. 2020-152787, filed on Sep. 11, 2020, the contents of which are hereby incorporated herein by reference in their entireties.

BACKGROUND

Technical Field

The present disclosure relates to a light emitting device.

Description of Related Art

Light emitting devices using LEDs are used in various products. A thin-type light emitting device that can be used for backlight devices for LCD displays and various lighting fixtures are disclosed in, for example, JP 2019-016766A.

SUMMARY OF THE INVENTION

An object of the present disclosure is to provide a thin-type light emitting device.

A light emitting device includes a plurality of light emitting elements, a plurality of light-transmissive members, a covering member, at least one first protrusion, and two second protrusions. The light emitting elements are aligned in a first direction. The light-transmissive members are respectively disposed on upper surfaces of the light emitting elements. The covering member includes at least one first covering portion and two second covering portions. The at least one first covering portion is arranged between adjacent ones of the light-transmissive members, and the two second covering portions are arranged at distal ends of the light emitting device in the first direction with the light-transmissive members being arranged between the two second covering portions. The at least one first protrusion is arranged on an upper surface of the at least one first covering portion and being spaced apart from the light-transmissive members. The two second protrusions respectively arranged on upper surfaces of the two second covering portions.

A light emitting device includes a light emitting element, a light-transmissive member, a light-guiding adhesive member, and a covering member. The light emitting element has an upper surface and lateral surfaces. The light-transmissive member is disposed on the upper surface of the light emitting element. The light-guiding adhesive member bonds the light emitting element and the light-transmissive member, the light-guiding adhesive member including a base material and organic particles dispersed in the base material. The covering member is disposed in contact with lateral surfaces of the light-transmissive member and in contact with the light-guiding adhesive member disposed on the lateral surfaces of the light emitting element.

The light emitting device according to the present disclosure can achieve the reduction in color unevenness and/or luminance unevenness in the emitted light.

BRIEF DESCRIPTION OF THE DRAWINGS

FIG. 2 is a schematic cross-sectional view taken along a line II-II in FIG. 1A showing a light emitting device according to the first embodiment.

FIG. 12 is an enlarged schematic cross-sectional view of a part of the light emitting device according to the first embodiment.

DETAILED DESCRIPTION OF EMBODIMENTS

Figure 1A:
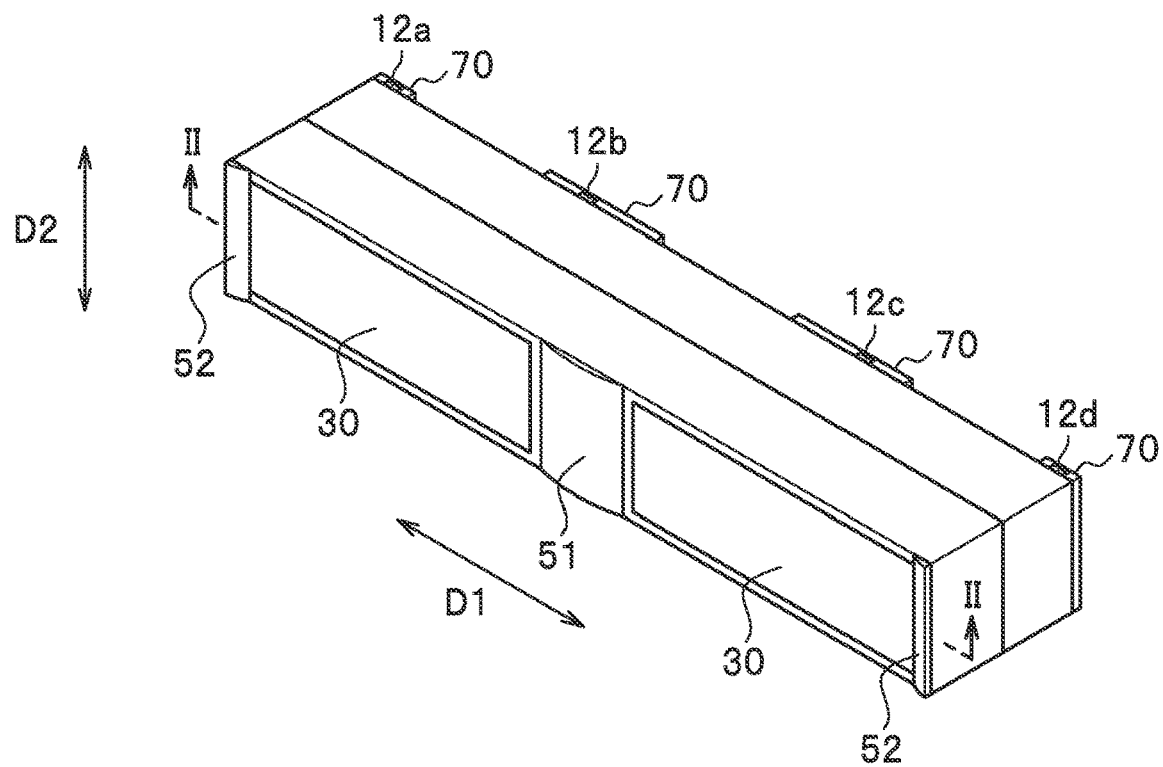
FIG. 1A is a schematic downward perspective view of a light emitting device according to a first embodiment.

Certain embodiments of the present disclosure will be described below with reference to the drawings. It is to be noted that the light emitting device described below is intended for implementing the dissipated technical concept of the present invention, and the present invention is not limited to those described below unless otherwise specified. Description given in one embodiment and/or one example can also be applied in other embodiments and/or other examples. The drawings referred to in the description below are to schematically illustrate the embodiments, and the size, a space or interval, locational relationship of the components and so forth be exaggerated or a portion of a component may not be shown. The directions illustrated in each figure are used to illustrate a relative locational relationship between the components, and are not intended to show absolute positional relationship. In the description below, the same designations or the same reference numerals denote the same or like members and duplicative descriptions will be appropriately omitted.

First Embodiment

A light emitting device 100 according to the first embodiment will be described with reference to FIG. 1 to FIG. 2.

The light emitting device 100 includes a plurality of light emitting elements 20 aligned in a first direction D1, a plurality of light-transmissive members 30 respectively disposed on upper surfaces of the plurality of light emitting elements 20, a covering member 40 including a plurality of first covering portions 41 respectively disposed between adjacent two of the plurality of light-transmissive members 30, and two second covering portions 42 disposed at distal ends in the first direction with the light-transmissive members located between the two second portions, first protrusions 51 respectively located on upper surfaces of the plurality of first covering portions 41 and being spaced apart from the light-transmissive members, and two second covering portions 42 respectively located on upper surfaces of the two second covering portions 42.

Structure of each component of the light emitting device 100 will be described below. In a plane view of the light emitting device 100, the first direction D1 is a longitudinal direction, and the second direction D2 is a lateral direction perpendicular to the first direction D1.

Substrate

A substrate 10 is a member on which the plurality of light emitting elements 20 to be mounted. The plurality of light emitting elements 20 are disposed aligned in a longitudinal direction D1 on the substrate 10. The substrate 10 includes at least a base member 11, wirings 12 and a plurality of via holes 15. The via holes 15 can be through-holes plated or filled with an electrically conductive material. The material of the electrically conductive material can be, for example, a metal material similar to the material of the wirings 12 described below.

Examples of the material of the base member 11 include a resin such as epoxy, glass epoxy, bismaleimidotriazine or polyimide, or an insulating material such as ceramics or glass. More particularly, a material having a linear expansion coefficient similar to the linear expansion coefficient of the light emitting elements 20 can be preferably used. In view of mechanical strength, the base member 11 preferably has a minimum thickness of 0.05 mm or greater, more preferably 0.2 mm or greater.

In view of the thickness of the light emitting device, the base member 11 preferably has a maximum thickness of 0.6 mm or less, more preferably 0.5 mm or less, and further preferably 0.4 mm or less. The wirings 12 are disposed on the upper surface and the lower surface of the substrate 10 and provides a path for the supply of power to the plurality of light emitting elements 20. The wirings on the upper surface of the substrate 10 and the wirings on the lower surface of the substrate are respectively connected through via holes 15. The wirings 12 can be made of copper, iron, nickel, tungsten, chromium, aluminum, titanium, palladium, rhodium, silver, platinum, gold, or an alloy of two or more those metals. The wirings 12 can either be formed with a single layer or a multilayer made of one or more of those metals or alloys.

Figure 1B:
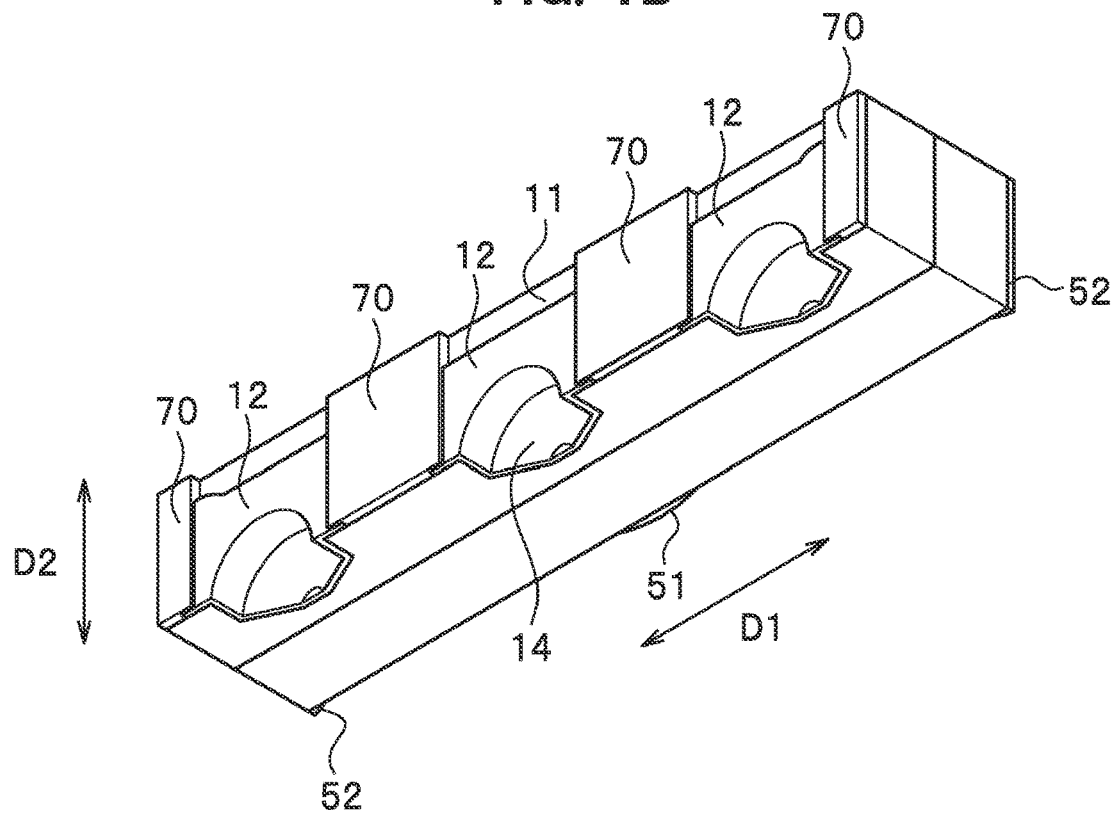
FIG. 1B is a schematic upward perspective view of a light emitting device according to the first embodiment.

An insulating film 70 may be disposed on the lower surface of the substrate 10 to ensure insulation and prevent short circuits. For such an insulating film, a known resin material such as a thermosetting resin, a thermoplastic resin, or the like, can be used. As illustrated in FIG. 1B, the lower surface of the substrate 10 can be formed with recesses 14 to secure the substrate 10 to an external mounting board, and electrodes, which are wirings 12, can be formed on the lower surface of the substrate and respectively in conformity to the recesses 14. The wirings in the recesses 14 can be electrically connected to an external mounting substrate, for example, through a bonding member such as a solder. Note that the wirings 12 illustrated in FIG. 1A are formed such that an end of each of the wirings 12a to 12d is exposed on one end of a respective one of the insulating films 70.

Light Emitting Element

The light emitting elements 20 are semiconductor elements such as LED chips which are configured to emit light when voltage is applied. Each of the light emitting elements 20 at least includes a semiconductor layered structure 22 and positive and negative electrodes 21. For the semiconductors, nitride-based semiconductor that can emit light of short-wavelength that can efficiently excite a wavelength-converting material is preferably employed. Such a nitride-based semiconductor can be represented by $In_xAl_yGa_{1-X-Y}N$ ($0 \le x$, $0 \le y$, $x+y \le 1$). The light emitting elements 20 have emission peak wavelengths in a range of 400 nm to 530 nm, more preferably in a range of 420 nm to 490 nm, further preferably in a range of 450 nm to 475 nm, in view of luminous efficiency and excitation efficiency of wavelength converting materials and mixed light colors of the emissions of the light emitting elements and the wavelength converting material. For the semiconductor material, InAlGaAs-based semiconductors, InAlGaP-based semiconductors, or the like can also be used.

Light-Transmissive Member

The light-transmissive members 30 are respectively disposed on the light emitting elements 20 to protect the light emitting elements 20. The light-transmissive members 30 include a base material 31 in which a wavelength converting material 32 can be contained. For the base material 31 of the light-transmissive member, for example, a resin such as a silicone resin, an epoxy resin, a phenol resin, a polycarbonate resin, or an acrylic resin, or glass can be used. The base material 31 of the light-transmissive member may contain a filler such as silicon oxide, aluminum oxide, zirconium oxide, or zinc oxide. The light-transmissive member can be formed of a single layer of one base material or formed of a multilayer of two or more of those base materials.

The light-transmissive member 30 may be disposed via a light-guiding adhesive member 60. The light-guiding adhesive member is configured to bond the light emitting element and the light-transmissive member and to guide light from the light emitting element 20 to the light-transmissive member 30. The material of the light-guiding adhesive member 60 can be, for example, silicone resin which may contain a filler similar to the filler contained in the base material 31 of the light-transmissive member 30. The filler contained in the light-guiding adhesive member 60 may be an inorganic material as described above or an organic material. Also, one type of filler may be used, or a combination of two or more types of filler material may be used. Examples of organic fillers include resins such as epoxy resins, silicone resins, and amorphous fluorine resins.

The wavelength converting material 32 can absorb at least a portion of primary light emitted from the light emitting element 20 and emit secondary light that has a wavelength different from that of the primary light. Examples of the wavelength converting materials 32 include yttrium-aluminum-garnet-based fluorescent materials (for example, $Y_3(Al, Ga)_5O_{12}:Ce$), lutetium-aluminum-garnet-based fluorescent materials (for example: $Lu_3(Al, GA)_5O_{12}:Ce$), terbium-aluminum-garnet-based fluorescent materials (for example, $Tb_3(Al, Ga)_5O_{12}:Ce$), β-sialon-based fluorescent materials (for example, $(Si, Al)_3(O, N)_4:Eu$), α-sialon-based fluorescent materials (for example, $Mz(Si, Al)_{12}(O, N)_{16}$, in which $0<z \le 2$, M is Li, Mg, Ca, Y, or a lanthanoid element other than La and Ce), nitride-based fluorescent materials such as CASN-based fluorescent materials (for example, $CaAlSiN_3:Eu$) and SCASN fluorescent materials (for example, $(Sr, Ca)AlSiN_3:Eu$), fluoride-based fluorescent materials such as KSF-based fluorescent materials (for example, $K_2SiF_6:Mn$) and MGF-based fluorescent materials (for example, $3.5MgO.0.5MgF_2.GeO_2:Mn$), CCA-based fluorescent materials (for example, $(Ca, Sr)_{10}(PO_4)_6C_{12}:Eu$), and quantum dot fluorescent materials. For the wavelength converting material 32, a single fluorescent material of one type of the fluorescent materials illustrated above may be used, or a combination of two or more types of the fluorescent materials can be used.

Covering Member

The covering member 40 is disposed to cover and protect the upper surface of the substrate 10 and lateral surfaces of the light emitting element 20 and of the light-transmissive member 30. The covering member 40 includes a first covering portion 41 and a second covering portion 42. The first covering portion 41 is located between adjacent light-transmissive members 30 in a longitudinal direction D1. The second covering portion 42 is located at each of the distal ends of the adjacent light-transmissive members 30 in the longitudinal direction D1 (i.e., on the lateral sides of the adjacent light-transmissive members 30 in the longitudinal direction, which are opposite to the sides where the first covering portion 41 is located). The first covering portion 41 and the second covering portion 42 have a width substantially the same as the light emitting device 100 in a lateral direction D2. A first protrusion 51 is disposed on the first covering portion 41 and a second protrusion 52 is disposed on each of the second covering portions 42.

In view of light extraction efficiency in the frontward direction, the covering member 40 preferably has light-reflecting properties. For example, an optical reflectance of 70% or greater, more preferably 80% or greater, further preferably 90% or greater to light with an emission peak wavelength of the light emitting element 20. It is also preferable that the covering member 40 is white, such that a base material of the covering member 40 preferably contains white pigments such as titanium oxide or magnesium oxide. Specific examples of the base material of the covering member 40 include a resin such as silicone resin, epoxy resin, phenol resin, polycarbonate resin, or acrylic resin, or a modified resin thereof. The base material of the covering member 40 may contain a filler that is similar to the filler contained in the base material 31 of the light-transmissive member.

First Protrusion and Second Protrusion

The first protrusion 51 and the second protrusions 52 are disposed on the upper surface of the covering member 40 to reduce the contact between the upper surface of the light-transmissive member 30 and external component(s). Examples of external components include light guide plates for backlighting. The first protrusion 51 is disposed on the upper surface of the first covering portion 41 and is spaced apart from the light-transmissive member 30 at a distance of G1. The second protrusions 52 are respectively disposed on the upper surfaces of the second covering portions 42. The second protrusions 52 may be respectively spaced apart from the light-transmissive members 30 at a distance G1 as in the first protrusion 51, or may be at a distance different from the distance G1. The second protrusions 52 may be in contact with the upper surface of the light-transmissive member 30, which can further reduce possibility of damage of the light-transmissive member 30 caused by the light-transmissive member 30 coming into contact with other external components.

The size of the first protrusion 51 and the second protrusions 52 can be adjusted according to the size of the light emitting device 100, the pressure loaded on the upper surface of the light emitting device 100, the materials of other external components, etc. The first protrusion 51 has a height H1 and each of the second protrusions 52 has a height H2 from the upper surface of the first covering portion 41, and for example, the heights H1 and H2 are in a range of 10 to 100 μm, respectively. The light emitting device 100 is provided with the first protrusion 51 and the second protrusions 52, which allows for reducing or preventing direct contact of the light-transmissive member 30 with external components, particularly with a light guide plate, and reducing or preventing damage to the light-transmissive member 30. Further, providing an air layer of at least 10 μm between the light-transmissive member 30 and the light guide plate allows dispersion of light through a light-incident part of the light guide plate. However, the air layer of an excessive thickness of several hundred micrometers may result in a reduction in the backlight output power. Therefore, the heights H1 and H2 are preferably in a range of 10 to 100 μm, more preferably in a range of 20 to 50 μm. For example, the light emitting device 100 can be formed with the upper surface of the first covering portion 41 having a width in a range of 470 to 530 μm and the upper surface of each of the second covering portions 42 with a width in a range of 70 to 130 μm, and the upper surface of each of the light-transmissive members 30 in a range of 1.2 to 1.26 mm, in the longitudinal direction D1 of the light emitting device 100. In this case, the distance G1 is preferably in a range of 10 to 125 μm, more preferably in a range of 50 to 100 μm. This arrangement can reduce an effect of the first protrusion 51 on the light extracted to the outside from the upper surface of the light-transmissive member 30, and thus can preferably maintain the light distribution properties of the light emitting device 100.

The first protrusion 51 can be formed in a semicircular shape in a cross-section in the longitudinal direction D1. Accordingly, the first protrusion 51 has a curved upper surface, which means that the upper surface has an arc shape in a cross-section which does not include a sharp edge, such that the first protrusion 51 is not easily damaged when it comes into contact with other external components. In the present specification, the term "semicircular shape" refers to a shape having a protruding curve-shaped upper portion and a straight line at the bottom such as shapes including a circular segment. Examples of such shapes include shapes having an upper portion in an arc shape, an elliptic shape, or a portion of a parabola shape, etc. In addition, the first protrusion 51 has a rectangular shape in a plan view, extending on the upper surface of the first covering portion 41 to both edges of the upper surface of the first covering portion in the lateral direction D2. This arrangement can reduce or prevent the light emitting surface (an upper surface of the light-transmissive member 30) of the light emitting device 100 from being inclined with respect to the light incidence surface of the light guide plate at the time of disposing the light emitting device 100. Further, forming the first protrusion 51 and the second protrusion 52 using the same material as the covering member 40 can increase the adhesion force with the covering member 40, and thus can reduce or prevent the first protrusion 51 and the second protrusion 52 from separating from the covering member 40 when he first protrusion 51 or/and the second protrusion 52 come into contact with external components. Meanwhile, in order to enhance a contact resistance to external components, the first protrusion 51 and the second protrusion 52 preferably have a rigidity greater than that of the covering member 40. The rigidity can be enhanced by, for example, adding a reinforcement material such as titanium oxide in the material of the first protrusion 51 and the second protrusion 52. The content of such a reinforcement material is preferably in a range of 10 to 60 wt %, more preferably in a range of 30 to 40 wt %. When a phenyl silicone resin is used for the covering member 40 in view of reliability, the phenyl silicone resin or a silicone resin of the same system, for example, a modified silicone resin that can provide high mechanical strength and good adhesion to the covering material 40 is preferably used for the first protrusion 51 and the second protrusion 52. With this arrangement, the resin used for the first protrusion 51 and the second protrusion 52 can obtain mechanical strength that is two to three times greater than the mechanical strength of the resin used in the covering member 40. Therefore, the first protrusion 51 and the second protrusion 52 can have rigidity greater than that of the covering member 40. The rigidity can be measured by tensile testing. In addition, the first protrusion 51 and the second protrusion 52 are formed separately from the covering member 40 in the present embodiment, but may be formed integrally as one component with the covering member 40.

The light emitting device 100 has the first protrusion 51 and the second protrusion 52, which allows for reducing or preventing the light emitting surface from coming in contact with external components etc., while spacing the first protrusion 51 from the light-transmissive member 30, which reduce effect on the light extracting and thus allows for maintaining good light distributing properties, and thus a light emitting device that can be used for a thin, narrow-frame applications can be realized.

Method of Manufacturing Light Emitting Device According to First Embodiment

Next, a method of manufacturing the light emitting device 100 will be described with reference to FIG. 2 to FIG. 3D, and FIG. 11.

A method of manufacturing a light emitting device 100 includes;

(S11) disposing a plurality of light emitting elements in aligned relation in a row direction D3 and a column direction D4 perpendicular to the row direction D3 on an upper surface of a substrate 1000 in a state of before singulating, (S12) disposing a light-transmissive member 30 on an upper surface of each of the light emitting elements 20, (S13) forming a covering member 400 covering the upper surface of the substrate 1000, lateral surfaces of each of the light emitting elements 20 and lateral surfaces of each of the light-transmissive members 30, (S14) forming protrusions 500 on an upper surface of the covering member 400, and (S15) singulating the substrate 1000, the covering member 400, and the protrusions 500 along the row direction D3 and the column direction D4, at predetermined locations demarcating individual units P1 including the light emitting elements 20 and the light-transmissive members 30.

In the step S14 of forming protrusions 500, first protrusions 510 that are not to be divided along a column direction D4 and second protrusions 520 that are to be divided along the column direction D4, are disposed, in which the first protrusions 510 are spaced apart from respective ones of adjacent light-transmissive members 30.

Now, each step in a method of manufacturing a light emitting device 100 will be described below. In the description below, the first protrusion(s) 510 and the second protrusion(s) 520 are referred to that in a state of before singulating. In addition, the row direction D3 corresponds to a longitudinal direction D1 in the light emitting device 100 obtained by singulating, and the column direction D4 corresponds to a lateral direction D2 in the light emitting device 100 obtained by singulating.

Disposing Light Emitting Element In Aligned Relation

Figure 3A:
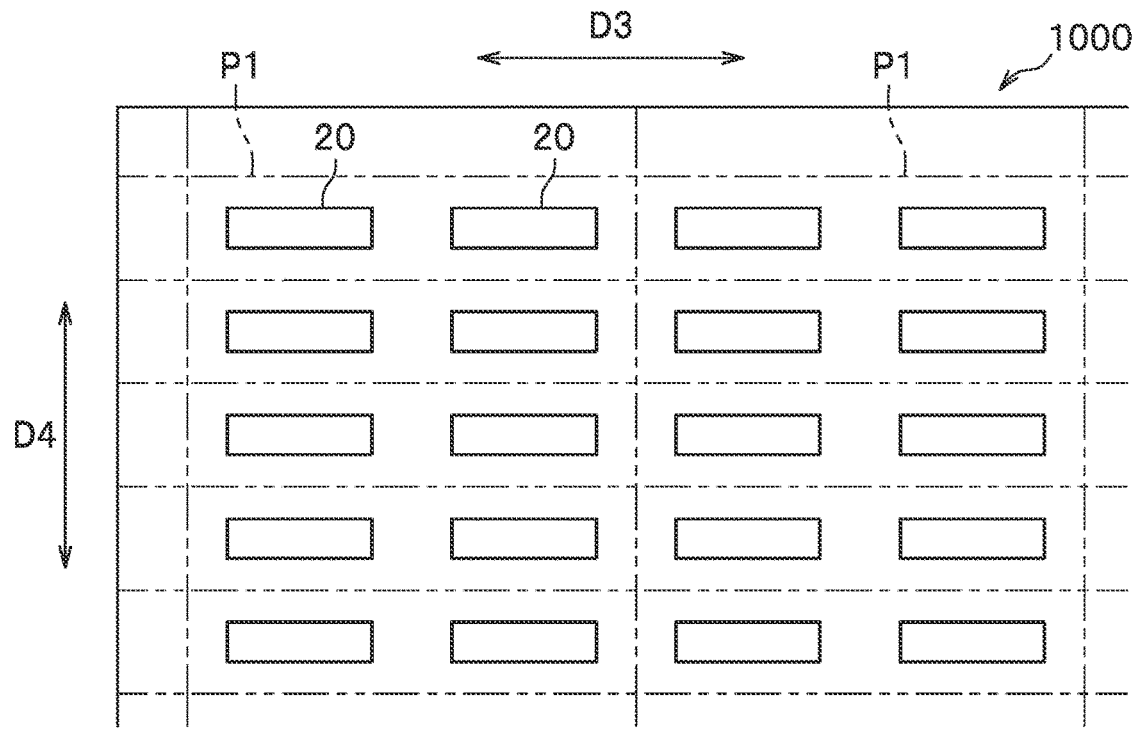
FIG. 3A is a schematic plane view illustrating an example of a method of manufacturing according to the first embodiment.

As shown in FIG. 3A, a plurality of light emitting elements 20 are aligned in row direction D3 and column direction D4 on an upper surface of a substrate 1000 in a state of before singulating. Wirings configured to serve as wirings after singulating as shown in FIG. 2 are disposed on an upper surface and a lower surface of the substrate 1000. FIG. 3A shows a partial representation of the substrate 1000 in which the wirings are not shown. The positive and negative electrodes 21 of each of the light emitting elements 20 are electrically connected to the wirings on the upper surface of the substrate 1000 through an electrically conductive adhesive member. Examples of the electrically conductive adhesive member include bumps made of gold, silver, copper, or the like, electrically conducting paste including a resin binder and metal powder of gold, silver, copper, platinum, aluminum, or the like, solders such as tin-silver-copper (SAC)-based solders and tin-bismuth-(SnBi) based solder.

Disposing Light-Transmissive Member

Subsequently, a light-transmissive member 30 is disposed on the upper surface of each of the light emitting elements 20. Disposing of the light-transmissive member 30 can be carried out, for example, bonding a light-transmissive member 30 formed in a size to cover the upper surface of a single light emitting element 20 on the upper surface of each of the light emitting elements 20. Each of the light-transmissive members can be adhered to a corresponding one of the light emitting elements 20 using a light-guiding adhesive member 60.

Forming Covering Member

Figure 3B:
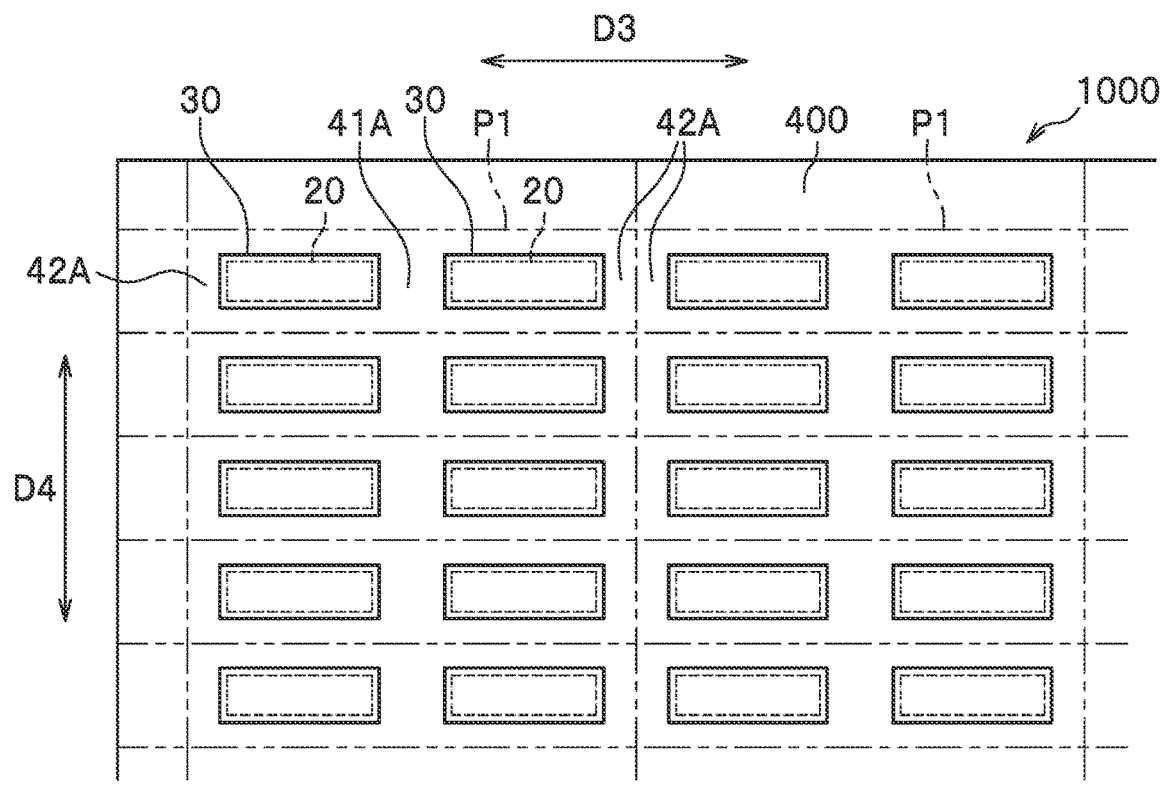
FIG. 3B is a schematic plane view illustrating an example of a method of manufacturing according to the first embodiment.

Subsequently, a covering member 400 is formed to cover the upper surface of the substrate 1000, lateral surfaces of the light emitting elements 20 and lateral surfaces of the light-transmissive members 30. FIG. 3B shows an intermediate body in which the light emitting elements 20 and light-transmissive members 30 are disposed on the upper surface of the substrate 1000, and the covering member 400 is formed. The covering member 400 may be formed to enclose the light-transmissive members 30, then the upper surfaces of the light-transmissive members 30 can be exposed by grinding, etc. It is preferable to perform grinding to flatten the upper surfaces of the light-transmissive members 30 and the upper surface of the covering member 400 before the step (S14) of forming protrusions to form the protrusions to be described below.

Forming Protrusion

Figure 3C:
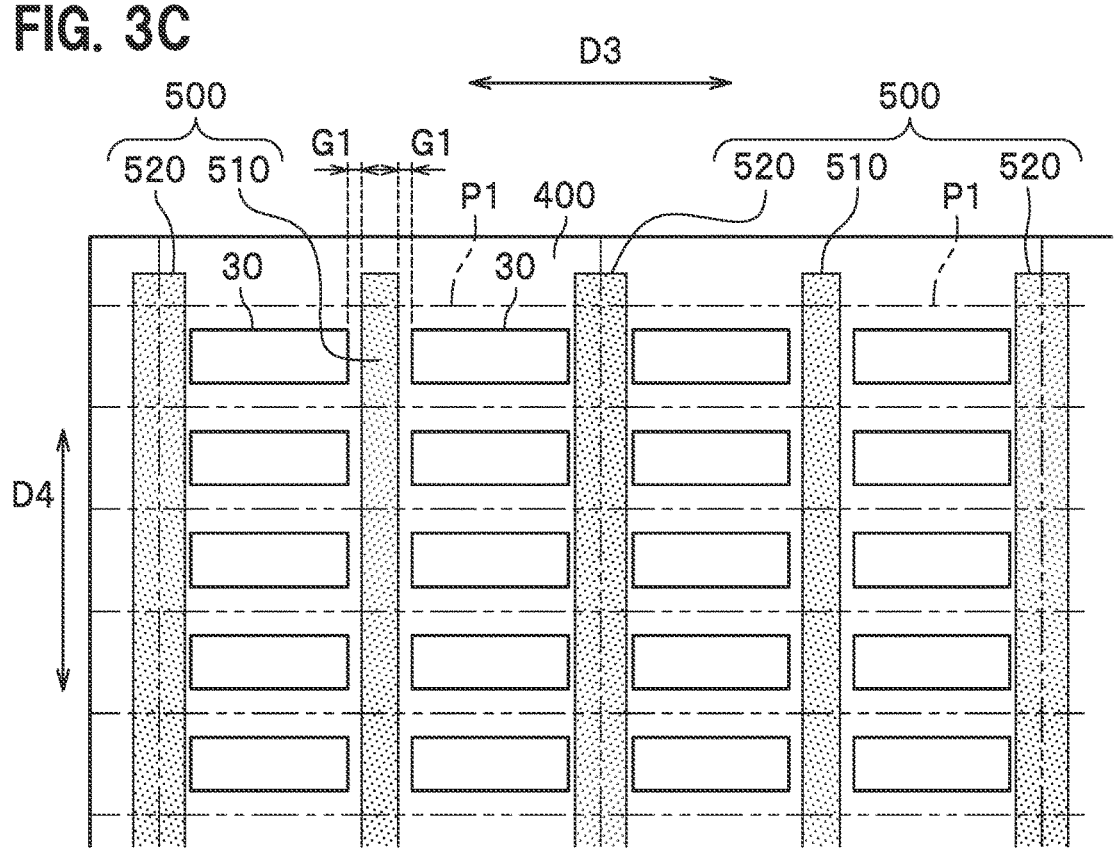
FIG. 3C is a schematic plane view illustrating an example of a method of manufacturing according to the first embodiment.
Figure 3D:
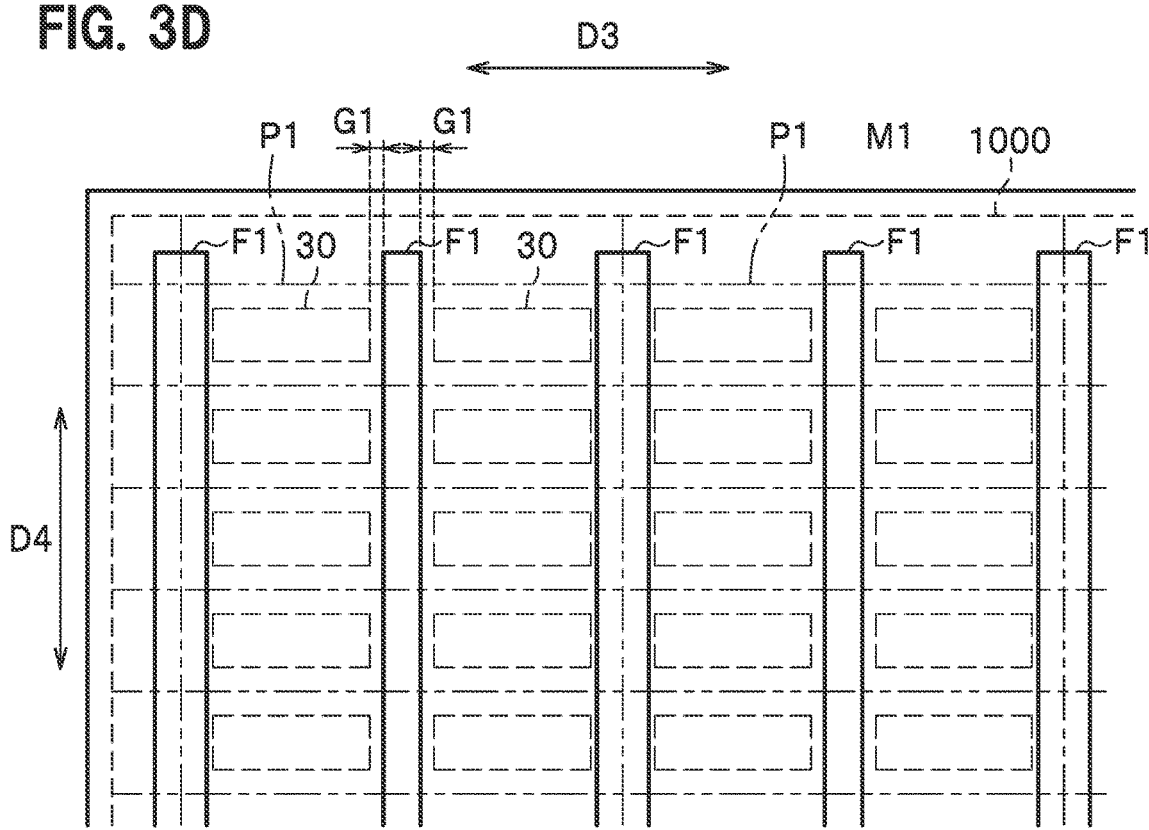
FIG. 3D is a schematic plane view illustrating an example of a method of manufacturing according to the first embodiment.

Subsequently, as shown in FIG. 3C, protrusions 500 are formed the covering member 400 and the upper surface a protrusion 500 is formed. Using a mask defining openings corresponding to shapes of the protrusions 500 in a plan view, the protrusions 500 are formed between lateral sides of adjacent light-transmissive members 30. The protrusions 500 can be formed through the openings of the mask, by way of, for example, printing or spraying uncured resin material, in which the spraying can be carried out by using inkjet technique or spraying technique. An example of a mask M1 with openings F1 is shown in FIG. 3D.

In the step (S14) of forming protrusions 500, the first protrusions 510 and the second protrusion 520 that are in a state of before singulation are formed. As shown in FIG. 3B, the first protrusions 510 formed in regions 41A corresponding to the first covering portions 41 in the light emitting devices 100 to be obtained after singulating are not divided along the column direction D4 in the step (S15) of singulating. The second protrusions 520 formed in regions 42A corresponding to the second protrusions 42 in the light emitting devices 100 to be obtained after singulating are divided along the column direction D4 in the step (S15) of singulating.

The first protrusions 510 are formed spaced apart from the light-transmissive members 30. The second protrusions 520 are formed approximately symmetrically with respect to a cutting plane in the column direction D4. As shown in FIG. 3C, the second protrusions 520 and the first protrusions 510 are formed in linear shapes along the column direction D4.

With this arrangement, the first protrusion 51 can be formed separated from the light-transmissive members, without covering the light-transmissive members 30 in the light emitting device 100 to be obtained after singulating. The second protrusions 52 in the light emitting devices 100 after singulating can be formed with substantially uniform shapes.

The protrusions 500 can be formed, for example, by applying an uncured resin material to predetermined locations and then cured.

Singulating

The substrate 1000, the covering member 400, and protrusions 500 which are in a state of before singulating are then singulated along the row direction D3 and the column direction D4, at predetermined locations demarcating individual units P1 including the light emitting elements 20 and the light-transmissive members 30. Singulating can be carried out by using, for example, a rotary blade or a laser.

Grinding the lateral surfaces of the light-transmissive members 30 may be carried out before forming the covering member. By grinding the lateral surfaces of the light-transmissive members 30, the locations and angles of the lateral surfaces can be adjusted for a corresponding one of the predetermined locations demarcating individual unit P1, such that thicknesses of the covering members can be appropriately secured.

Second Embodiment

Figure 4:
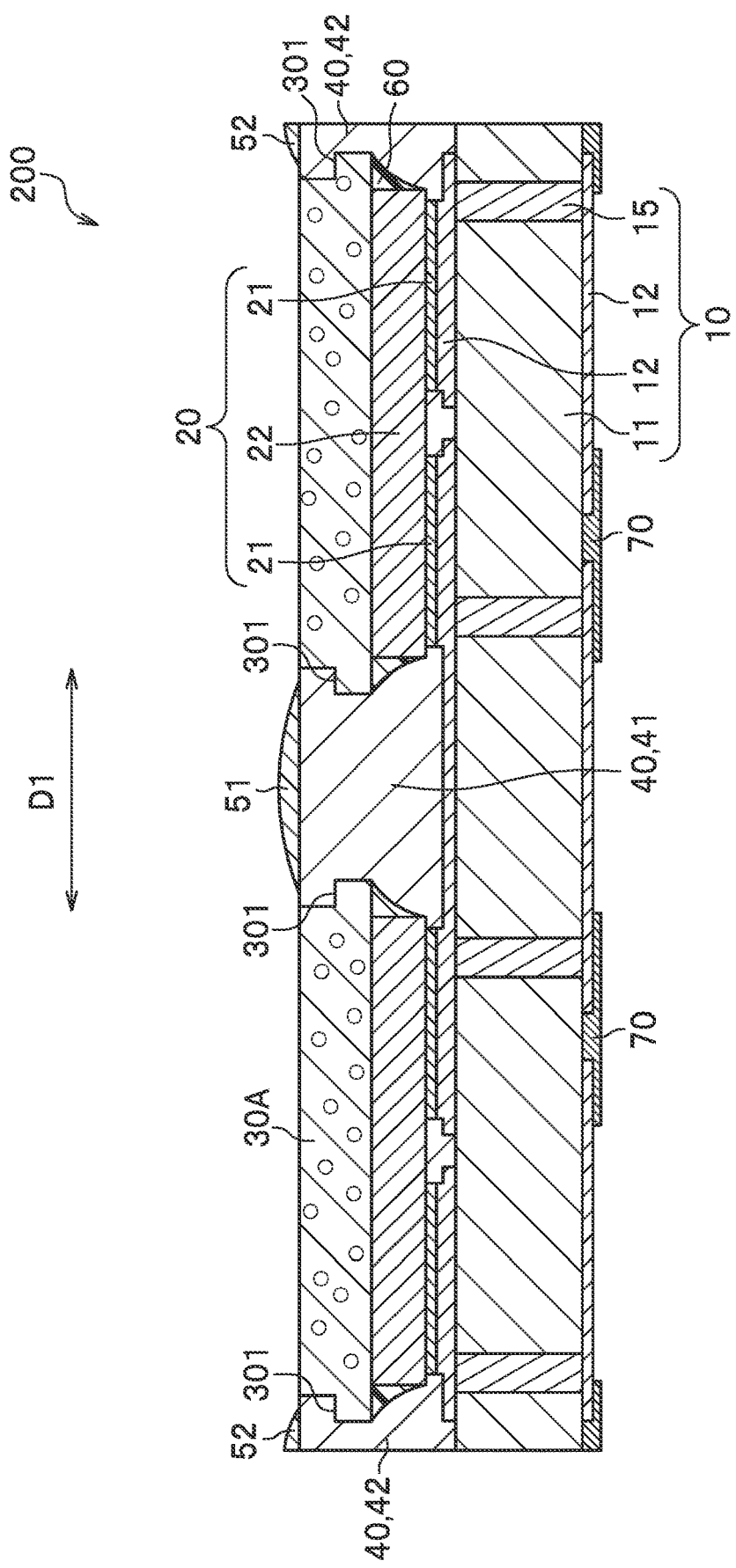
FIG. 4 is a schematic cross-sectional view showing a light emitting device according to a second embodiment.

Next, a light emitting device 200 according to a second embodiment will be described below with reference to FIG. 4, and FIGS. 5A to 5C. As shown in FIG. 4, the light emitting device 200 has the light-transmissive member and the covering member having shapes different from that of the light emitting device 100 of the first embodiment.

The light-transmissive members 30A of the light emitting device 200 respectively have a step portion 301 at their both ends in a longitudinal direction, at least in a cross-section in the longitudinal direction D1. The step portions 301 are portions of the light-transmissive members 30A with a smaller thickness. With the step portions 301, each of the light-transmissive members 30A has a shape having a smaller width at its upper side and a greater width at its lower surface side in a cross-section in the longitudinal direction D1. Each of the light-transmissive members 30A may also have step portions in the cross-section in the lateral direction D2. In other words, each of the light-transmissive members 30A may have a step portion formed continuously on all the lateral surfaces, such that the step portion surrounds the entire lateral surfaces. Also, it is preferable that the lateral surfaces located at ends in the longitudinal direction D1 of each of the light-transmissive members 30A preferably have a surface roughness at a lower portion with greater width of each of the lateral surfaces greater than a surface roughness that each of the sides of the longitudinal D1 of the light-transmissive members 30A have a larger surface finish on the side of the wide area on the lower side than on the narrow area on the upper side.

The first protrusion 51 and the second protrusions 52 can be disposed spaced apart from a corresponding one of the light-transmissive members 30A. The separation distance between the first protrusion 51 and each of the light-transmissive members 30A may differ from the separation distance between one of the second protrusions 52 and the corresponding light-transmissive member 30A. In addition, only the first protrusion 51 may be spaced apart from the light-transmissive members 30A. Further, it is preferable that at least a portion of the first protrusion 51 and a portion of each of the second protrusions 52 are located overlapped with the step portion 301 of a corresponding one of the light-transmissive members 30A in a plan view.

Each of the light-transmissive members 30A has a step portion 301 at each end portion in the longitudinal direction D1 in which stress tends to occur due to heat compared to the ends in the lateral direction D2, and accordingly, detachment of the light-transmissive member 30A from the covering member 40 can be effectively reduced or prevented. Further, the light-transmissive members 30A have a large surface roughness on the lateral surfaces of the step portions 301, which can further reduce occurrence of detachment from the covering member 40. Further, the first protrusion 51 and the second protrusions 52 are located partially overlapping the step portions 301, which can reinforce the covering member 40 and can further reduce or prevent detachment of the light-transmissive member 30A.

The step portions 301 of the light-transmissive members 30A can be formed before the light-transmissive members 30A are disposed on the upper surfaces of the light emitting elements 20, or can be formed after the light-transmissive members 30A are disposed on the upper surfaces of the light emitting elements 20.

Figure 5A:
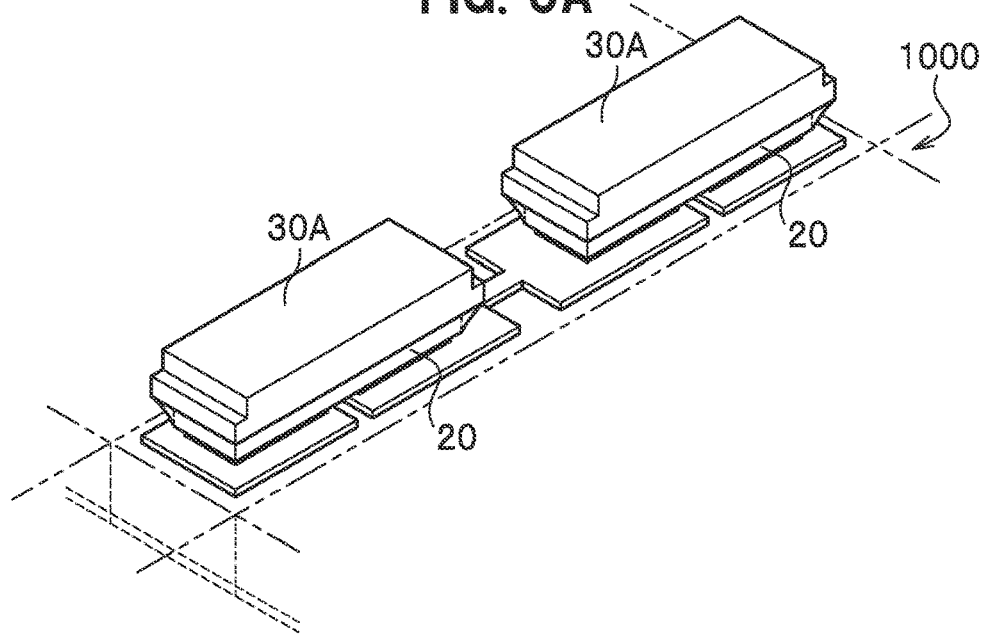
FIG. 5A is a schematic perspective view showing a light emitting device according to the second embodiment, in which a first protrusion, second protrusions, and a covering member are not shown.
Figure 5B:
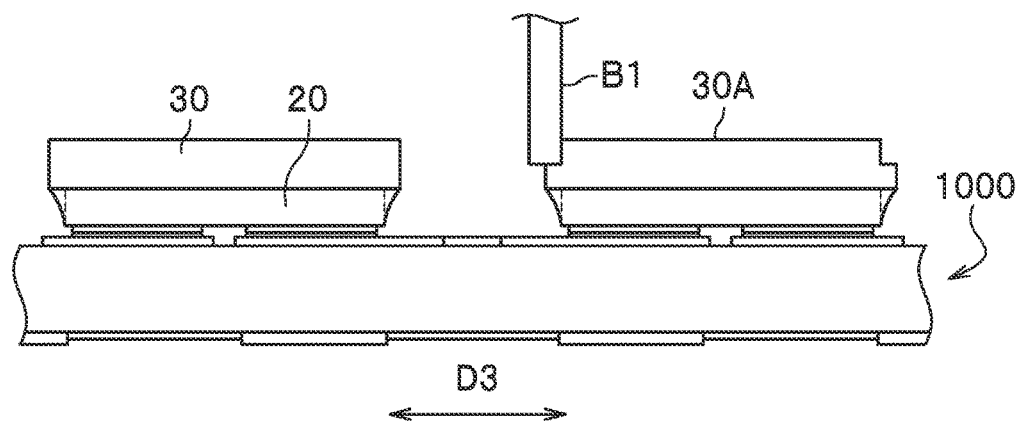
FIG. 5B is a schematic lateral surface view illustrating an example of a method of manufacturing according to the second embodiment.
Figure 5C:
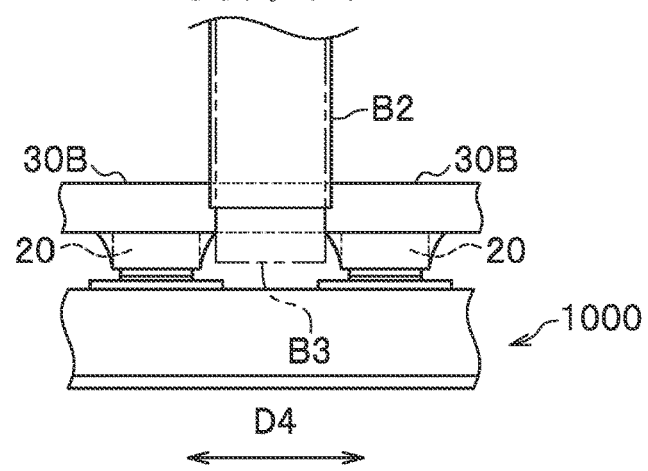
FIG. 5C is a schematic lateral surface view illustrating an example of a method of manufacturing according to the second embodiment.

The step portions 301 can be formed by grinding portions of the lateral surfaces of the light-transmissive members. For example, grinding can be performed using a disc-shaped rotary blade. As shown in FIG. 5B, the step portions may be formed by grinding upper portions of the lateral surfaces at both ends of the light-transmissive members using a disc-shaped rotary blade B1. Alternatively, as an example shown in FIG. 5C, predetermined portions of a sheet-shaped light-transmissive member 30B may be ground or cut using two disc-shaped rotary blades B2 and B3 of different diameters. In the example shown in FIG. 5C, the thicker rotary blade B2 forms a recess defined with an upward-facing surface in the sheet-shaped light-transmissive member 30B, while the thinner rotary blade B3 forms a step portion at the end of the light-transmissive member 30B in a cross-section in the column direction D4 by separating the light-transmissive member 30B at the upward-facing surface of the recess.

Example of Wiring Shape

The wirings 12 disposed on the upper and lower surfaces of the substrate 10 can be arranged in various shapes to suit the application and manufacturing method of the light emitting devices. Some examples will be illustrated below.

Figure 6A:
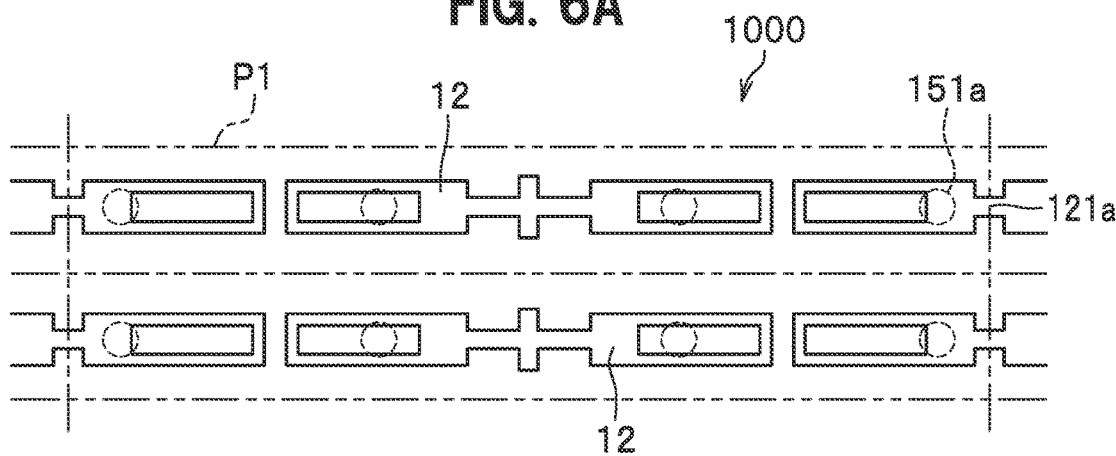
FIG. 6A is a schematic top view showing an example of shape of wiring disposed on a substrate in a light emitting device according to one embodiment of the present disclosure.
Figure 6B:
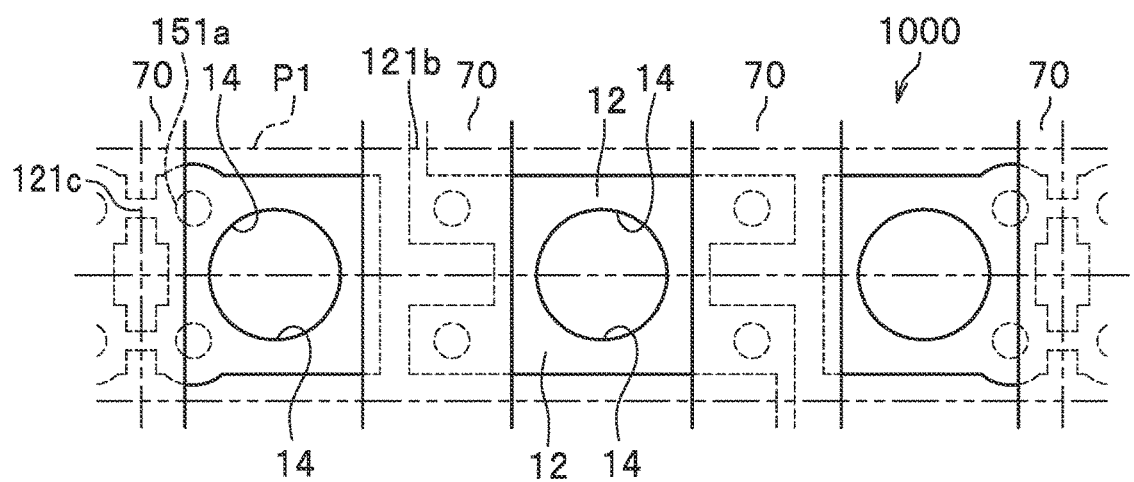
FIG. 6B is a schematic bottom view showing an example of shape of wiring disposed on a substrate in a light emitting device according to one embodiment of the present disclosure.
Figure 6C:
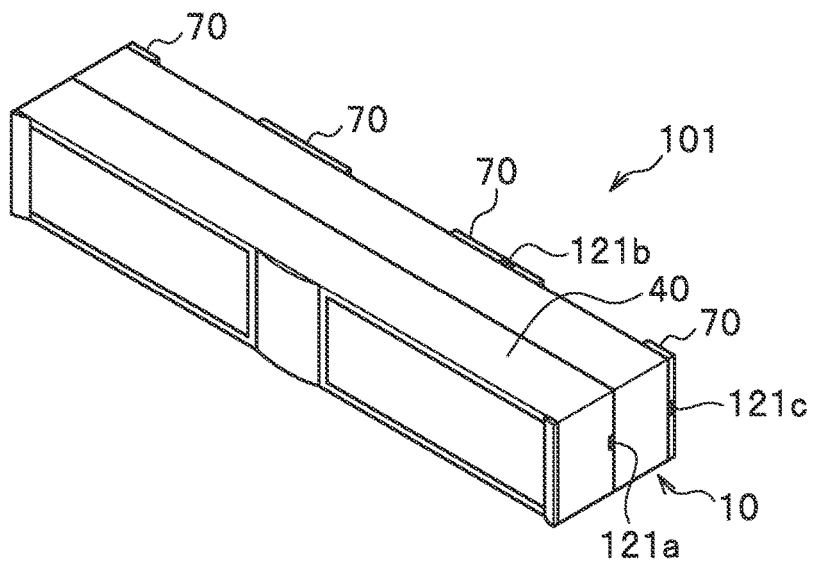
FIG. 6C is a schematic perspective view showing an example of a light emitting device that includes the wiring having a shape shown in FIG. 6A or FIG. 6B.

As shown in FIG. 6A to FIG. 6C, the light emitting device 101 has six wirings exposed on the lateral surfaces (that include two short-side lateral surfaces and two long-side lateral surfaces). That is, on one of the two short-side lateral surfaces, a wiring 121a is exposed from the covering member 40 of the upper surface of the substrate 10 and a wiring 121c is exposed from an electrically insulating film 70 on the lower surface of the substrate 10. The wirings 121a and 121c are electrically connected to each other through respective via holes 151a. The wirings 121a and 121c are also exposed in a same manner on the other short-side lateral surface. On one of the two long-side lateral surfaces, a wiring 121b is exposed from one of the electrically insulating films 70 on the lower surface of the substrate 10. The wiring 121b is also exposed in the same manner on the other long-side lateral surface.

Figure 7A:
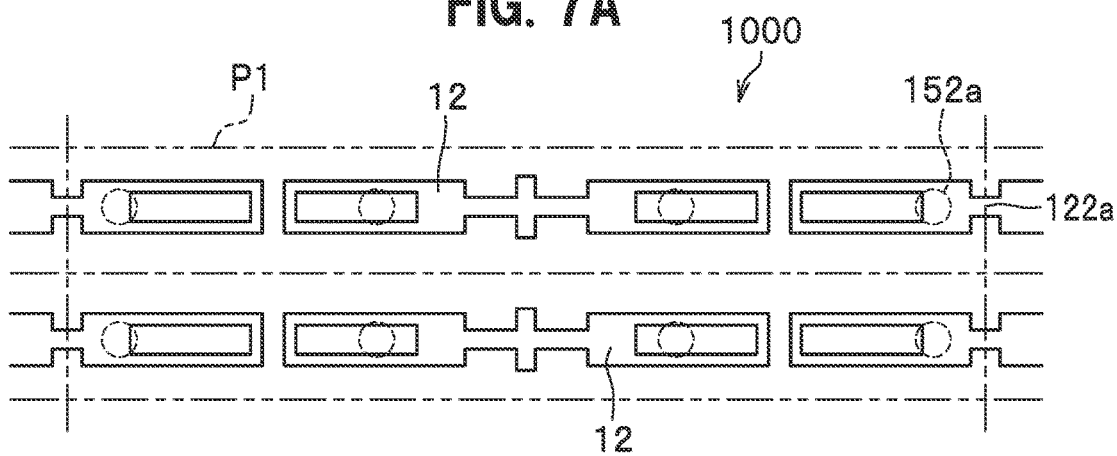
FIG. 7A is a schematic top view showing an example of shape of wiring disposed on a substrate in a light emitting device according to one embodiment of the present disclosure.
Figure 7B:
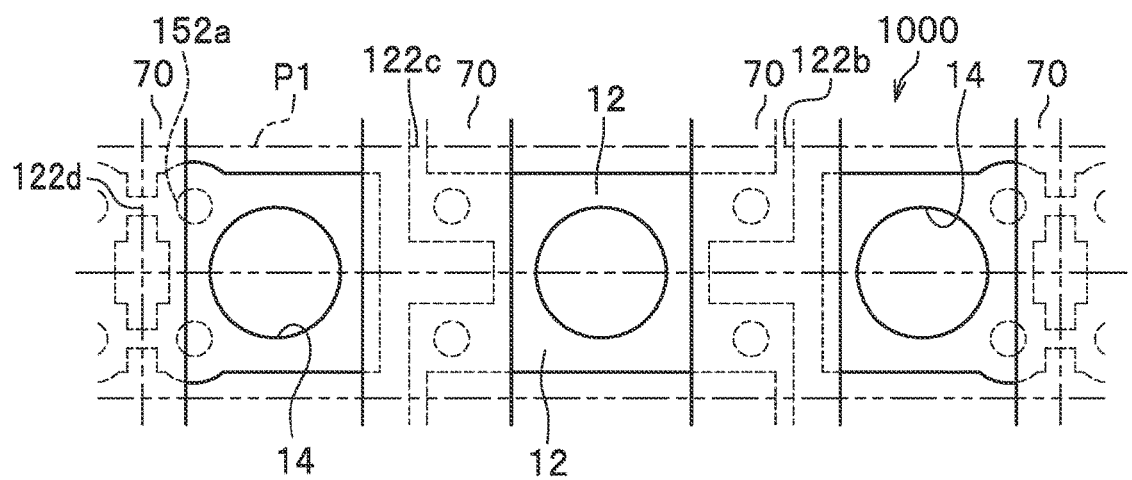
FIG. 7B is a schematic bottom view showing an example of shape of wiring disposed on a substrate in a light emitting device according to one embodiment of the present disclosure.
Figure 7C:
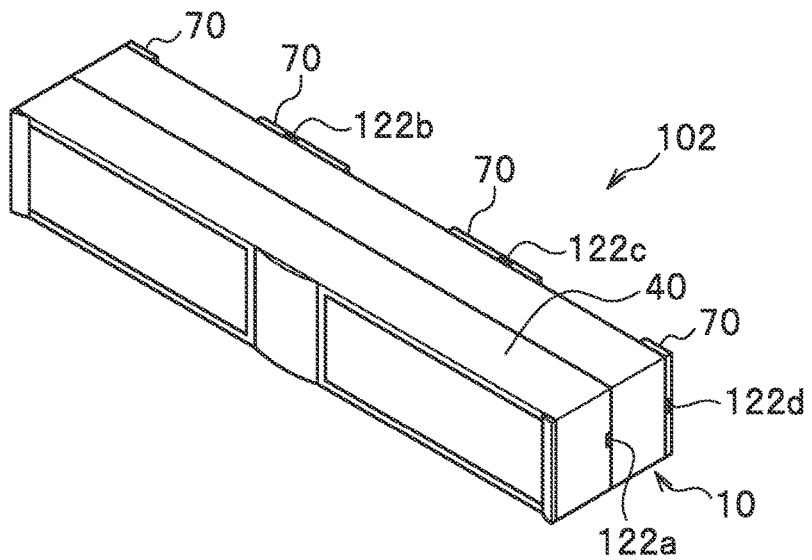
FIG. 7C is a schematic perspective view showing an example of a light emitting device that includes the wiring having a shape shown in FIG. 7A or FIG. 7B.

As shown in FIG. 7A to FIG. 7C, the light emitting device 102 has six wirings exposed on the lateral surfaces (that include two short-side lateral surfaces and two long-side lateral surfaces). That is, on one of the two short-side lateral surfaces, a wiring 122a is exposed from the covering member 40 of the upper surface of the substrate 10 and a wiring 122d is exposed from an electrically insulating film 70 on the lower surface of the substrate 10. The wirings 122a and 122d are electrically connected to each other through respective via holes 151a. The wirings 122a and 122d are also exposed in a same manner on the other short-side lateral surface. On one of the two long-side lateral surfaces, wirings 122b and 122c are exposed from two of the electrically insulating films 70 on the lower surface of the substrate 10. The wirings 122b and 122c are electrically connected to each other through the wiring 12 on the lower surface of the substrate 10.

Figure 8A:
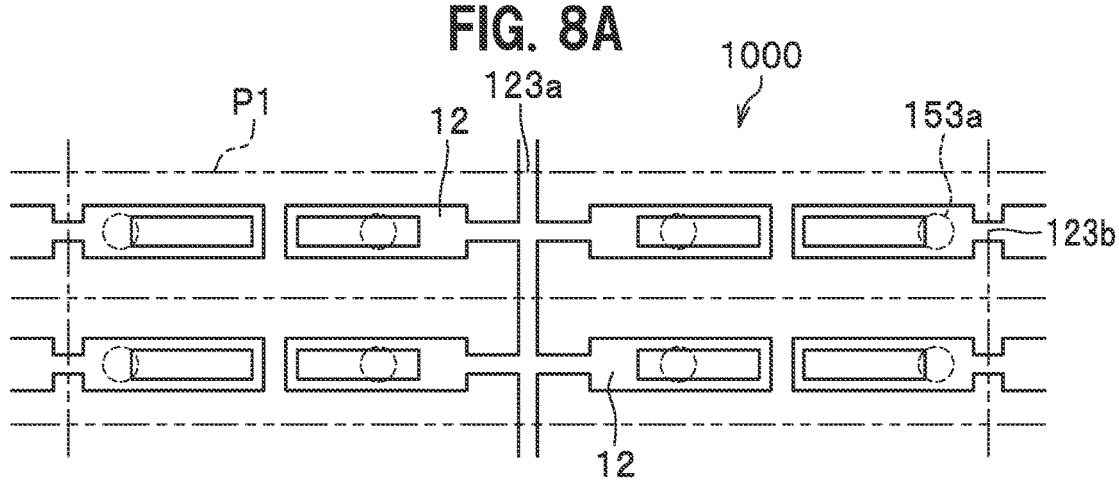
FIG. 8A is a schematic top view showing an example of shape of wiring disposed on a substrate in a light emitting device according to one embodiment of the present disclosure.
Figure 8B:
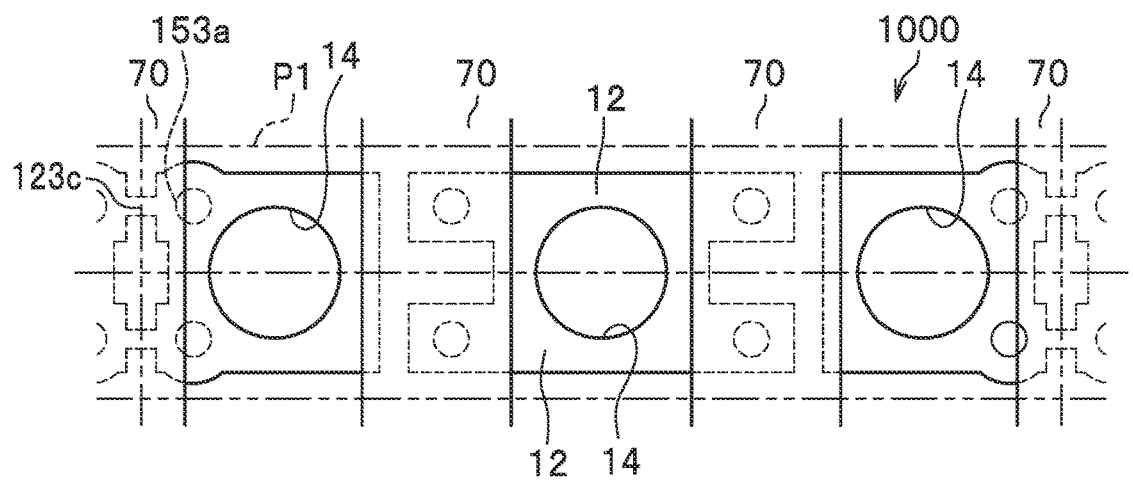
FIG. 8B is a schematic bottom view showing an example of shape of wiring disposed on a substrate in a light emitting device according to one embodiment of the present disclosure.
Figure 8C:
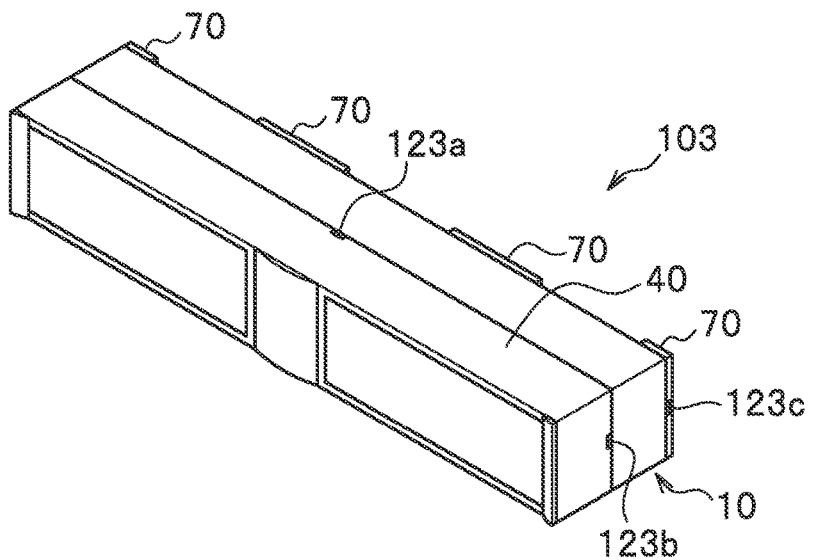
FIG. 8C is a schematic perspective view showing an example of a light emitting device that includes the wiring having a shape shown in FIG. 8A or FIG. 8B.

The light emitting device 103 has six wirings exposed on the lateral surfaces as shown in FIG. 8A to FIG. 8C. That is, on one of the two short-side lateral surfaces, a wiring 123c is exposed from the covering member 40 of the upper surface of the substrate 10 and a wiring 123c is exposed from an electrically insulating film 70 on the lower surface of the substrate 10. The wirings 123b and 123c are electrically connected to each other through respective via holes 153a. The wirings 123b and 123c are also exposed in a same manner on the other short-side lateral surface. On one of the two long-side lateral surfaces, a wiring 123a is exposed from the covering member 40 on the upper surface of the substrate 10. The wiring 123a is also exposed in the same manner on the other long-side lateral surface.

The examples of the wiring shapes shown in FIG. 6A to FIG. 8C can be applied to any embodiments and variational examples for various shapes of the first protrusions. The lateral surfaces of the light emitting device may face an external conductive component such as a metal. In such cases, occurrence of a short circuit can be further avoided by not exposing a portion of the wiring 12 connected to the positive electrode of the light emitting element 20 and a portion of the wiring 12 connected to the negative electrode of the light emitting element 20 to the same lateral surface of the light emitting device.

VARIANT EXAMPLES

Example without a Substrate

Figure 10:
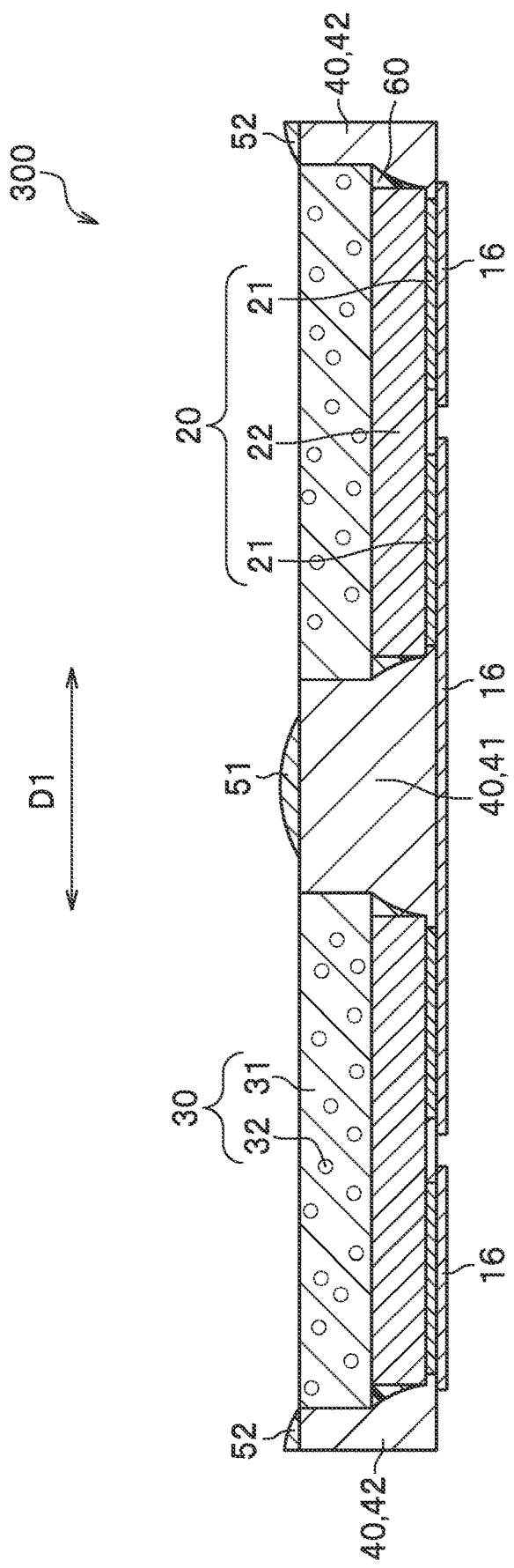
FIG. 10 is a schematic cross-sectional view of a light emitting device that does not have a substrate according to one embodiment of the present disclosure.
Figure 11:
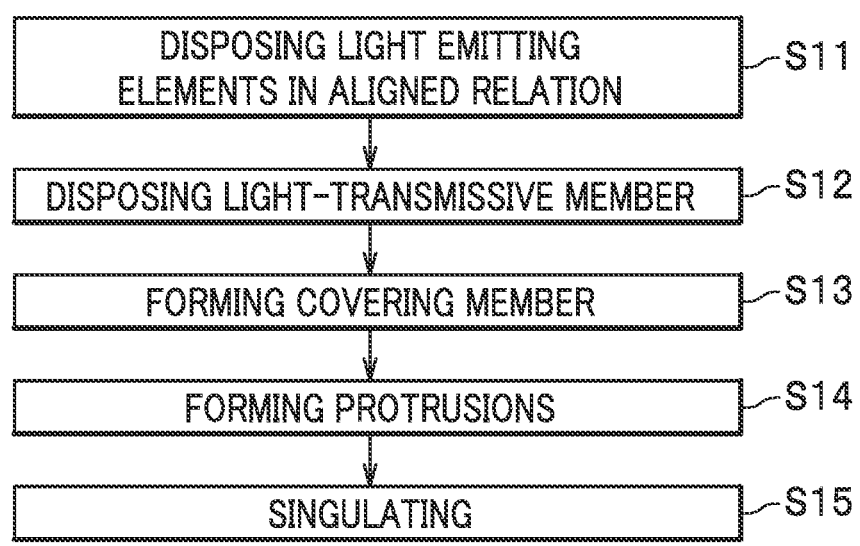
FIG. 11 is a flow chart showing a procedure of a method of manufacturing a light emitting device according to one embodiment of the present disclosure.

The light emitting device does not need to include the substrate, as in the light emitting device 300 shown in FIG. 10. The light emitting device 300 has smaller dimensions because it does not have a substrate. When a substrate is not present, the wiring to the light emitting element 20 can be carried out by, for example, forming disposing a conductive film 16 that faces the element electrodes 21 of the light emitting element 20. For example, the light emitting device 300 can be secured to an external mounting substrate by using the surface having the conductive film 16 disposed thereon as the mounting surface.

Variational Examples of Shape of First Protrusion

The shape of the first protrusion can be adjusted according to the shape and conditions of other external components, etc., to which the light emitting device is to face. Variational examples of the shape of the first protrusion 51 will be illustrated below with reference to FIG. 9A to FIG. 9I.

Variational Example 1

Figure 9A:
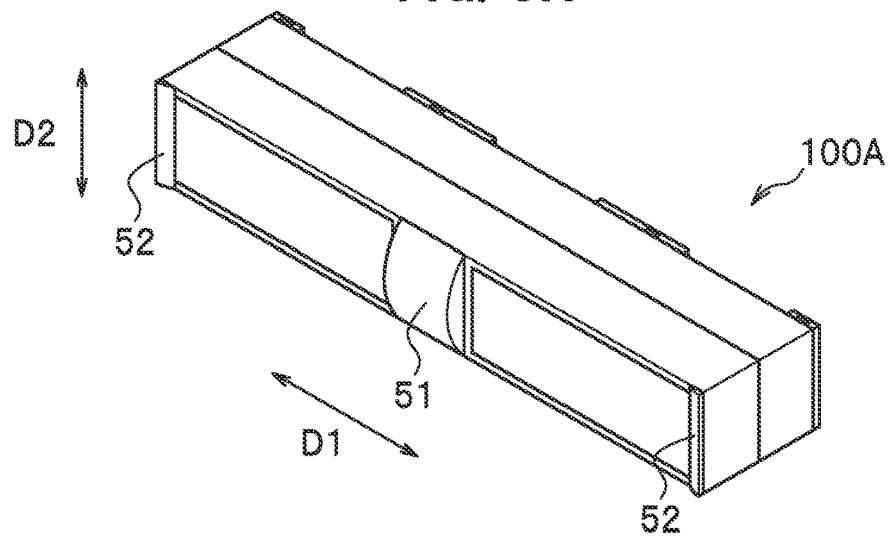
FIG. 9A is a schematic perspective view showing a first variational example of the first protrusion of a light emitting device according to one embodiment of the present disclosure.

As shown in FIG. 9A, the first protrusion 51 of the light emitting device 100A may have a semicircular cross-sectional shape in the second direction D2. The second protrusion 52 may have a shape the same as that described above. The first protrusion 51 of the light emitting device 100A has a semicircular cross-sectional shape which allows the light emitting device 100A to have a curved portion on its upper surface, accordingly, damage to the first protrusion 51 hardly occurs when the first protrusion 51 comes into contact with other external components.

Variational Example 2

Figure 9B:
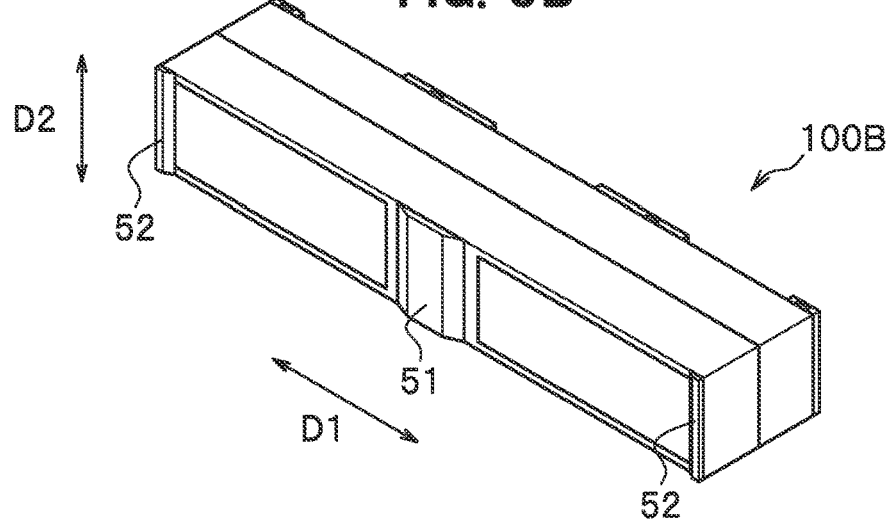
FIG. 9B is a schematic perspective view showing a second variational example of the first protrusion of a light emitting device according to one embodiment of the present disclosure.

As shown in FIG. 9B, the first protrusion 51 of the light emitting device 100B may have a trapezoidal cross-sectional shape in the first direction D1. When the first protrusion has a flat upper surface, the light emitting device 100B can face to other external components or the like with the flat surface. The second protrusion 52 may also have a trapezoidal cross-sectional shape in the first direction D1. The upper surfaces of the first protrusion 51 and the second protrusion 52 may be arranged on the same plane.

Variational Example 3

Figure 9C:
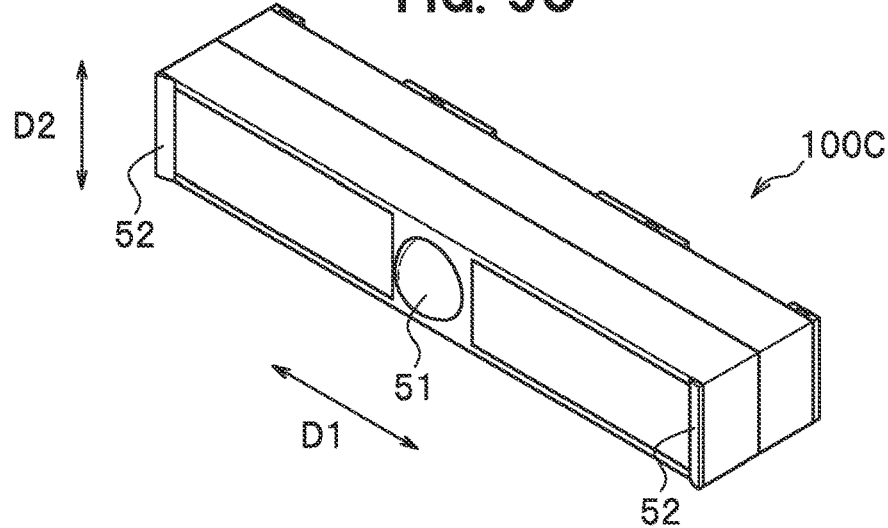
FIG. 9C is a schematic perspective view showing a third variational example of the first protrusion of a light emitting device according to one embodiment of the present disclosure.

As shown in FIG. 9C, the first protrusion 51 of the light emitting device 100C may have a circular shape in a plan view, which may be a shape of a portion of a sphere. The first protrusion 51 has a circular shape in a plan view, such that the first protrusion 51 does not have an irregular outline in the plan view, making it difficult to break. The second protrusion 52 may have a shape same as described above. The first protrusion 51 of the light emitting device 100C has a shape of a portion of a sphere, that is, the first protrusion 51 has a curved upper surface, such that the first protrusion 51 is hardly damaged when it comes into contact with other external components.

The first protrusion 51 preferably has a width greater than the width of the light-transmissive member 30 in the second direction (lateral direction) D2. With the width of the first protrusion 51 in the lateral direction D2 greater than the width of the light-transmissive member 30, the force from other external member applied to the first protrusion 51 can be dispersed over a wide range. Therefore, the covering member 40 can reduce or prevent deformation near the light-transmissive member 30.

Variational Example: First Protrusion Having First Portion and Second Portion

According to the shape and conditions of other external components to which the light emitting device faces, the first protrusion may include a first portion and a second portion. Some examples of the first protrusion that includes the first portion and a second portion. The configurations described earlier may be denoted with the same or similar numerals and description of those may be omitted. The grooves shown in each of variational examples may be formed using masks with openings defined in conformity to the grooves. Alternatively, the grooves shown in each of variational examples may be formed by grinding the first protrusion that have been formed without grooves.

Variational Example 4

Figure 9D:
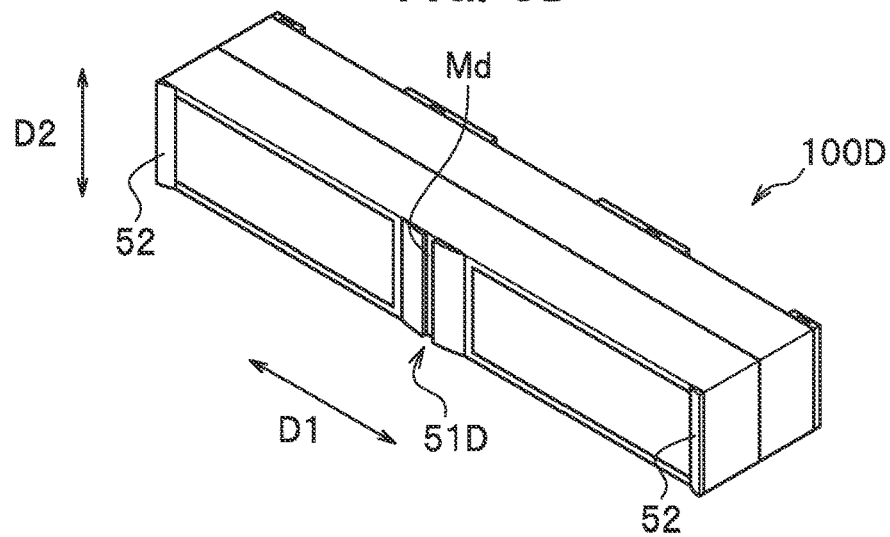
FIG. 9D is a schematic perspective view showing a fourth variational example of the first protrusion of a light emitting device according to one embodiment of the present disclosure.

As shown in FIG. 9D, in the light emitting device 100D, the first protrusion 51D has a first portion and a second portion aligned adjacent to each other in the first direction D1 with a groove Md between the first portion and the second portion. The distance (i.e., the width of the groove Md) between the first portion and the second portion is preferably in a range of 15 to 100 μm, more preferably in a range of 30 to 50 μm. The first portion and the second portion are formed in a compressed quadrant shape in a cross section in the first direction D1, with the perpendicular surfaces facing each other. In other words, each of the first portion and the second portion has a cross-sectional shape in the first direction D1, which is similar to a circular segment divided in half along the sagitta, with a flat surface corresponding the sagitta in each of the first portion and the second portion facing each other.

Variational Example 5

Figure 9E:
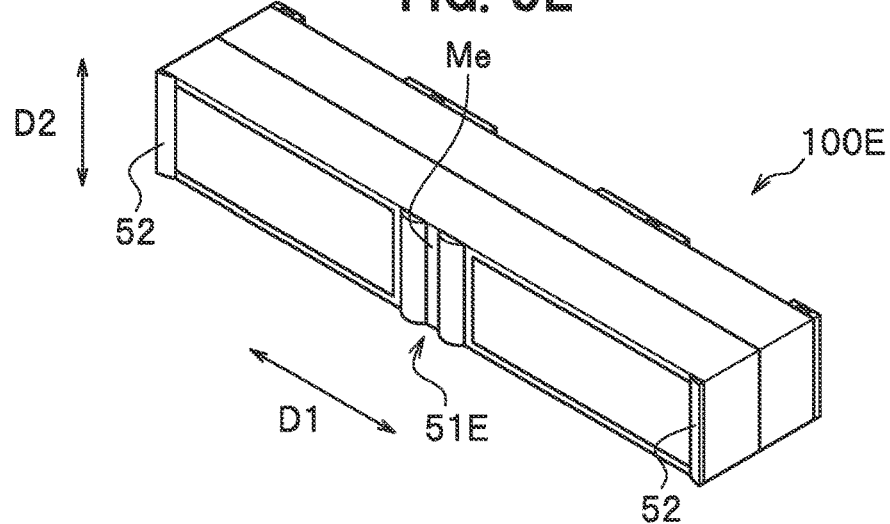
FIG. 9E is a schematic perspective view showing a fifth variational example of the first protrusion of a light emitting device according to one embodiment of the present disclosure.

As shown in FIG. 9E, in the light emitting device 100E, the first protrusion 51E has a first portion and a second portion, which are aligned in the first direction D1 through the groove Me, and each of the first and second portions in the first direction D1 are formed in a semicircular cross-sectional shape. The distance (i.e., the width of the groove Me) between the first portion and the second portion is preferably in a range of 30 to 100 μm, more preferably in a range of 50 to 80 μm.

Variational Example 6

Figure 9F:
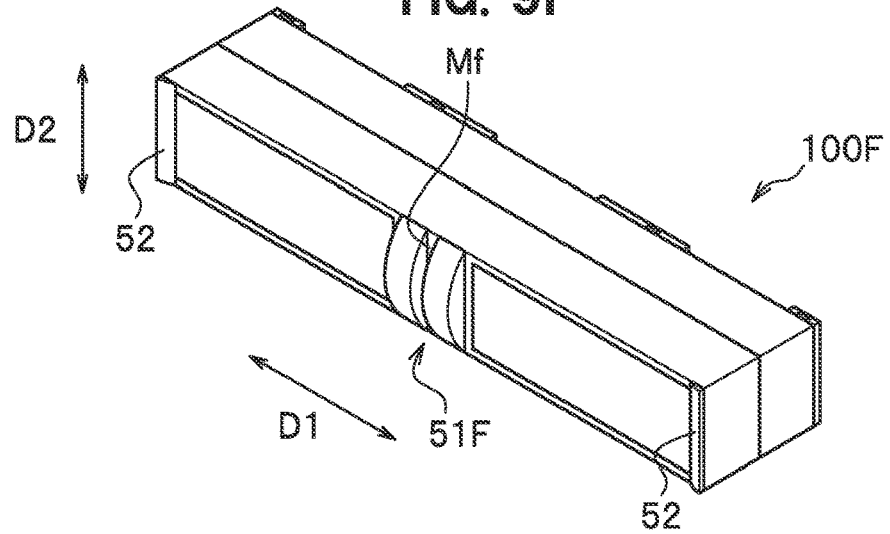
FIG. 9F is a schematic perspective view showing a sixth variational example of the first protrusion of a light emitting device according to one embodiment of the present disclosure.

As shown in FIG. 9F, in the light emitting device 100F, the first protrusion 51F has a first portion and a second portion, which are aligned in the first direction D1 through the groove Mf, and each of the first and second portions are formed in a rectangular cross-sectional shape in the first direction D1 and semicircular cross-sectional shape in the second direction D2. The distance (i.e., the width of the groove Mf) between the first portion and the second portion is preferably in a range of 15 to 100 μm, more preferably in a range of 30 to 50 μm.

Variational Examples 7-9

Figure 9G:
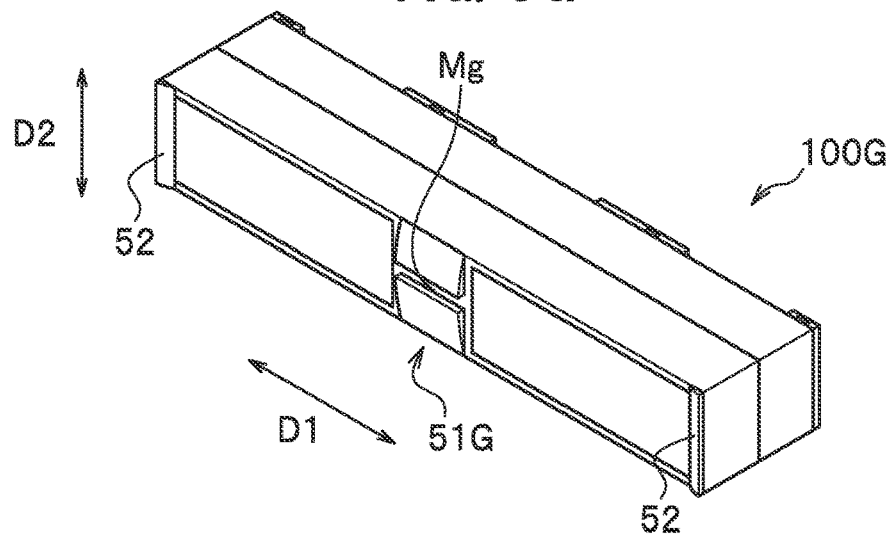
FIG. 9G is a schematic perspective view showing a seventh variational example of the first protrusion of a light emitting device according to one embodiment of the present disclosure.
Figure 9H:
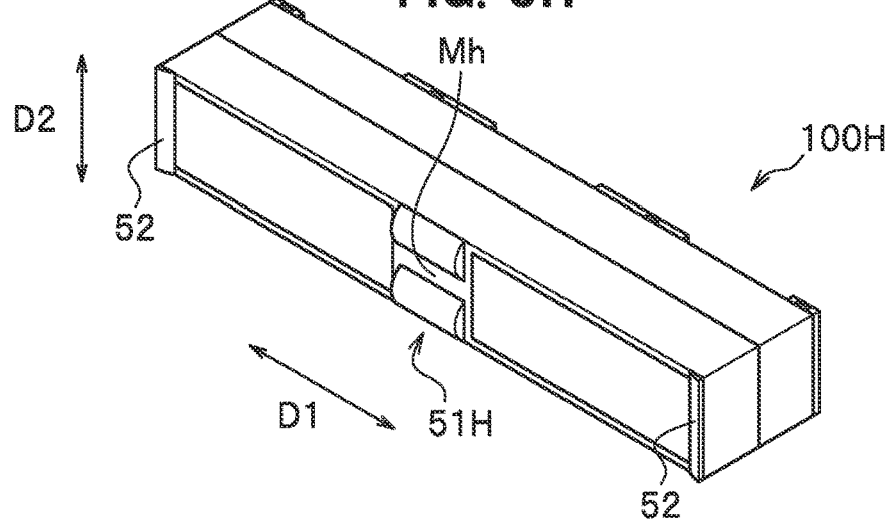
FIG. 9H is a schematic perspective view showing an eighth variational example of the first protrusion of a light emitting device according to one embodiment of the present disclosure.
Figure 9I:
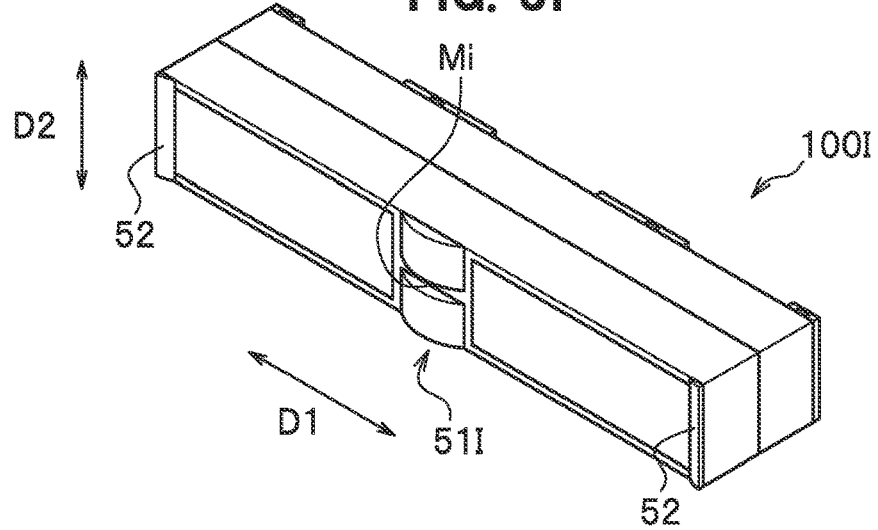
FIG. 9I is a schematic perspective view showing a ninth variational example of the first protrusion of a light emitting device according to one embodiment of the present disclosure.

As shown in FIG. 9G to FIG. 9I, the light emitting devices 100G to 100I respectively include first protrusions 51G-51I which are disposed in a similar manner as in the first protrusions 51D to 51F while changing the directions by 90 degrees. Accordingly, the first portion and the second portion of the first protrusion 51G are formed in a compressed quadrant shape in a cross section in the second direction D2. In other words, each of the first portion and the second portion has a cross-sectional shape in the first direction D1, which is similar to a circular segment divided in half along the sagitta, with a flat surface corresponding the sagitta in each of the first portion and the second portion facing each other. Further, each of the first and second portions of the first protrusion 51H are respectively formed in a semicircular cross-sectional shapes in the second direction D2. Further, each of the first and second portions of the first protrusion 51H is formed in a semicircular cross-sectional shape in the second direction D2. Also, each of the first portion and the second portion of the first protrusion 51I is formed in a semicircular cross-sectional shape in the first direction D1.

In the light emitting devices 100D to 100I, the first protrusion is separated by the groove into the first portion and the second portion, but the groove may be formed to a depth which does not completely separate the first protrusion. The groove may be formed deeper than the upper surface of the covering member 40, or may be formed penetrating the covering member 40 and expose the upper surface of the substrate 10.

Separating the first protrusion into the first portion and the second portion allows for the volume of each of the first and second portions approach to the volume of the second protrusion 52. This arrangement can improve uniformity during thermal expansion. Occurrence of cracks in the resin in the first protrusion at high temperatures can be reduced by pre-positioning the groove. By including the first and second portions in the first protrusion, the area and position of the first protrusion can be adjusted to meet other external components. The first and second portions may be aligned in a direction different from the first direction D1 and the second direction D2.

The first and second portions aligned in the second direction D2 may be respectively disposed outside the upper surface of the light-transmissive member 30 in the second direction D2. In other words, each of the first and second portions includes a portion positioned outward of an outer peripheral edge of upper surfaces of the light-transmissive members 30 in the second direction. With this arrangement, effect of the first protrusion on extraction of light can be further reduced. Further, increasing the distance between the edge of the first portion and the edge of the second portion allows the first protrusion more reliably supporting other external components.

Variational Example of Light-Guiding Adhesive Member

When the light-transmissive member 30 is disposed on the light emitting element 20 via a light-guiding adhesive member 60, the light emitting device according to the embodiments and variational examples described above can obtain a further higher luminous flux while maintaining a small thickness dimension by including a filler 62 with adjusted particle size and refractive index in the light-guiding adhesive member 60. A variational example of a method for incorporating the filler 62 in the light-guiding adhesive member 60 will be described below.

The light-guiding adhesive member 60 is disposed on the lateral surfaces of the light emitting elements 20 as shown in FIG. 2, and the covering member 40 is disposed in contact with the light-transmissive member 30. FIG. 12 is an enlarged cross-sectional view, showing a portion near a lateral surface of the light emitting element 20. A portion of the light emitted from the lateral surface 26 of the light emitting element 20 is reflected by the covering member 40, as light L1 shown in the figure. However, light that is not reflected by the covering member 40 and passes through the covering member 40 as the light L3 shown in the figure, does not contribute to the luminous flux extracted from the upper side of the light emitting device. As the light L2, the filler 62 contained in the light-guiding adhesive member 60 can scatter light, reducing the light transmitted through the covering member 40 and increasing the light contributing to the luminous flux extracted from the upper surface side of the light emitting device.

As shown in FIG. 12, it is preferable that the light-guiding adhesive member 60 disposed on the lateral surfaces 26 of each of the light emitting elements 20 extends from the edges of the lower surface 35 of the light-transmissive member 30 to the lateral surfaces 26 of the light emitting element 20. In this case, the surface 45, which is in contact with the light-guiding adhesive member 60 of the covering member 40, is at an acute angle with the lower surface 35 of the light-transmissive member 30. Therefore, the covering member 40 can efficiently reflect light emitted from the lateral surfaces 26 of each of the light emitting elements 20 toward the light-transmissive member 30. The light-guiding adhesive member 60 as described above has a reverse triangular shape in cross-section as shown in FIG. 2 and FIG. 12.

The light-guiding adhesive member 60 contains a filler 62 made of organic particles distributed in the base material 61. Silicone resin with a refractive index in a range of 1.35 to 1.55 is preferable as the filler 62 of organic particles in terms of heat resistance and light resistance. Furthermore, as a viscosity regulator, for example, a base material 61 that can contain nanosilica or zirconium oxide with a particle size of less than 100 nm.

For the base material 61, an epoxy resin, a silicone resin, or a modified resin or hybrid resin of those is preferable because they have good light-transmissive properties. In particular, a silicone resin having a refractive index in a range of 1.45 to 1.60 is preferable.

When the difference between the refractive index of the light-guiding adhesive member 60 and the refractive index of the covering member 40 is increased, light can be reflected efficiently at the interface between the light-guiding adhesive member 60 and the covering member 40.

The filler 62 tends to agglutinate due to capillary force when the particle size is small, and when the particle size is large, the layer of light-guiding adhesive member 60 between light emitting element 20 and the light-transmissive member 30 becomes thicker. For this reason, it is preferable that the organic particle filler 62 has an average particle size in a range of 0.5 to 1.2 μm. Because the particle size of the organic particle filler 62 is larger than the particle size of the viscosity adjusting agent described above, an increase in the viscosity is not likely occur even when the organic filler 62 is contained in the light-guiding adhesive member 60. Rayleigh scattering occurs for particles with small particle sizes, such as those of the viscosity adjusting agent described above, but Mie scattering occurs for organic particles of the filler 62, which effectively diffuses light from the light emitting element 20. Further, in order to obtain uniform dispersion of the filler 62, particle sizes of the filler 62 are preferably to be as close as possible, such that in the filler 62, particles of a size 0.3 μm or greater and 2.0 μm or less are preferably to be 80 volume % or greater, particles of a size 0.3 tm or greater and 2.0 μm or less are more preferably to be 85 volume % or greater. In particular, the filler 62 preferably include fewer particles of large particle sizes, such that particles of a size 2.5 μm or greater are preferably 4 volume % or less in the filler 62. The volume % indicated above is the ratio of the volume of the filler of that particle size to the volume of the overall filler. The particle size of the filler 62 can be determined, for example, by using an electrical resistance measuring method.

Meanwhile, when the absolute value of the difference between the refractive index of the filler 62 and the refractive index of the base material 61 is small, the scattered light caused by filler 62 decreases. For this reason, it is preferable that the refractive index of the filler 62 of organic particles is such that the absolute value of the difference between the refractive index of the filler 62 of organic particles and the refractive index of the base material 61 is 0.05 or greater.

With such a difference in refractive index between the base material 61 and the filler 62, light can be scattered efficiently.

By including the filler 62 in the light-guiding adhesive member 60 to be disposed on the lateral surfaces 26 of the light emitting elements 20, light emitted from the lateral surfaces 26 of the light emitting elements 20 can be scattered, reducing the light transmitted through the covering member 40, and increasing the luminous flux extracted from the upper surface side of the light emitting device, regardless of the number of the light emitting elements 20. The inclusion of the filler 62 in the light-guiding adhesive member 60 does not affect the small thickness dimension of the light emitting device. This allows the light emitting device to obtain a further greater luminous flux while maintaining its smaller thickness dimension.

A method of manufacturing a light emitting device that includes incorporating the filler 62 in the light-guiding adhesive member 60 having a light-guiding adhesive member 60 is the same as or similar to the respective methods according to the embodiments and variational examples. In below, portions of the method related to the light-guiding adhesive member 60 will be described.

The light-guiding adhesive member 60 can be manufactured by adding the filler 62 to the base material 61 and stirring. By stirring, the filler 62 can be dispersed in the base material 61. In order to efficiently scatter light, the filler 62 is preferably dispersed in the base material 61. With the use of a filler 62 having a specific gravity close to that of the base material 61, a state in which the filler 62 is dispersed in the base material can be maintained.

Then, by pressing the light-transmissive member 30 to the light emitting element 20 via the light-guiding adhesive member 60 In the step S12 of disposing light-transmissive member, the light-guiding adhesive member 60 is wet spread from outer periphery of the lower surface 35 of the light-transmissive member 30 onto the lateral surfaces 26 of the light emitting element 20, such that the light-guiding adhesive member 60 exhibiting an approximately inverted triangular cross section can be formed. The oblique side of the approximately inverted triangular cross section may be formed as a curved line or as an approximately straight line.

EXAMPLES

Examples of the light emitting device having the light-guiding adhesive member 60 that contains a filler 62 will be described below.

In Examples 1 to 3, a phenyl silicone resin having a refractive index of 1.54 is used for the base material 61 of the light-guiding adhesive member 60 and silicone resin particles having a refractive index of 1.43 are used, and the content of the silicone resin particles of the light-guiding adhesive member 60 is varied. The absolute value of the difference between the refractive index of the base material 61 and the refractive index of the filler 62 is 0.11.

The filler 62 has an average particle size of 0.8 μm, and satisfies a condition of particles having diameters of 2.5 μm or greater in a range of 4 volume % or less, and particles having diameters in a range of 0.3 to 2.0 μm in a range of 80 volume % or greater. The particle size can be measured using an electric resistance method, and the average particle size is the average value of those.

In addition, as Comparative Example, a light emitting device is fabricated in a similar manner as in Example 1 except for not to include silicone resin particles.

Evaluating results are shown in Table 1.

The scattered light value is calculated by 100−(linear transmission/total light transmission×100).

TABLE 1

| Item | | Unit | Comparative Example | Example 1 | Example 2 | Example 3 |
|---|---|---|---|---|---|---|
| | Silicone resin particle content | Weight % | NONE | 0.05 | 0.3 | 0.5 |
| Characteristics | Linear transmittance | % | 49 | 32 | 11 | 5 |
| | Total Light Transmittance | % | 82 | 81 | 77 | 75 |
| | Scattered light | % | 40 | 61 | 86 | 93 |
| | Viscosity | Pa · s | 3.7 | 3.7 | 3.6 | 3.8 |
| | Luminous Flux of Light Emitting Device (Relative Value) | % | Comparison Standard | +0.3 | +0.8 | +1.7 |

As shown in Table 1, when the content of silicone resin particles was increased, the scattered light was increased, and the light flux of the light emitting device was increased. In addition, the total light transmittance was not significantly decreased when the silicone resin particles were contained in the base material 61. Increasing the content of the organic particle fillers 62 tends to increase the viscosity of light-guiding adhesive member 60, making it difficult to handle it, and to decrease the total light transmittance of the light-guiding adhesive member 60. Therefore, the content of organic particles (silicone resin particles) is preferably in a range of 0.01 to 2.0 weight %, more preferably in a range of 0.05 to 0.5 weight %.

The weight percentage is the ratio of the mass of the filler to the mass of the base material.

It was confirmed that by including filler 62 with adjusted particle size and refractive index in the light-guiding adhesive member 60, the luminous flux of the light-emitting device can be increased while maintaining a smaller thickness dimension. Even if inorganic filler is used as the filler 62, when the particle size and refractive index are similar to those of the silicone resin particles described above, the effect of increasing the luminous flux is likely to be as effective.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a plurality of light emitting elements aligned in a first direction;
   a plurality of light-transmissive members respectively disposed on upper surfaces of the light emitting elements;
   a covering member including at least one first covering portion and two second covering portions, the at least one first covering portion being arranged between adjacent ones of the light-transmissive members, and the two second covering portions being arranged at distal ends of the light emitting device in the first direction with the light-transmissive members being arranged between the two second covering portions;
at least one first protrusion arranged on an upper surface of the at least one first covering portion and being spaced apart from the light-transmissive members; and
two second protrusions respectively arranged on upper surfaces of the two second covering portions.

2. The light emitting device according to claim 1, wherein the first protrusion and the two second protrusions are made of the same material as the covering member.

3. The light emitting device according to claim 1, wherein the first protrusion and the two second protrusions have a rigidity higher than a rigidity of the covering member.

4. The light emitting device according to claim 1, wherein the first protrusion has a rectangular shape in a plan view.

5. The light emitting device according to claim 1, wherein the first protrusion has a circular shape in a plan view.

6. The light emitting device according to claim 1, wherein the first protrusion has a semicircular shape in a cross-section along the first direction.

7. The light emitting device according to claim 1, wherein the first protrusion has a semicircular shape in a cross-section along a second direction that is orthogonal to the first direction.

8. The light emitting device according to claim 1, wherein the first protrusion has a trapezoidal shape in a cross-section along the first direction.

9. The light emitting device according to claim 1, wherein the first protrusion has a width greater than a width of each of the light-transmissive members in a second direction that is orthogonal to the first direction.

10. The light emitting device according to one of claim 1, wherein the first protrusion extends on the upper surface of the first covering portion to both ends of the upper surface of the first covering portion in the second direction that is orthogonal to the first direction.

11. The light emitting device according to claim 1, wherein
the first protrusion includes a first portion and a second portion aligned in the first direction.

12. The light emitting device according to claim 1, wherein
the first protrusion includes a first portion and a second portion aligned in a second direction that is orthogonal to the first direction.

13. The light emitting device according to claim 11, wherein
each of the first portion and the second portion has a compressed quadrant shape in a cross-section along the first direction having a flat surface portion orthogonal to the first direction, and the flat surface portion of the first portion and the flat surface portion of the second portion facing substantially in parallel to each other.

14. The light emitting device according to claim 11, wherein
each of the first portion and the second portion has a semicircular shape in a cross-section along the first direction.

15. The light emitting device according to claim 11, wherein
each of the first portion and the second portion has a semicircular shape in a cross-section along a second direction that is orthogonal to the first direction.

16. The light emitting device according to claim 12, wherein
each of the first portion and the second portion has a compressed quadrant shape in a cross-section along the second direction having a flat surface portion orthogonal to the second direction, and the flat surface portion of the first portion and the flat surface portion of the second portion facing substantially in parallel to each other.

17. The light emitting device according to claim 12, wherein
each of the first portion and the second portion has a semicircular shape in a cross-section along the second direction.

18. The light emitting device according to claim 12, wherein
each of the first portion and the second portion has a semicircular shape in a cross-section along the first direction.

19. The light emitting device according to claim 12, wherein
each of the first portion and the second portion includes a portion positioned outward of an outer peripheral edge of an upper surface of a corresponding one of the light-transmissive members in the second direction.

20. A light emitting device comprising:
a light emitting element having an upper surface and lateral surfaces;
a light-transmissive member disposed on the upper surface of the light emitting element;
a light-guiding adhesive member bonding the light emitting element and the light-transmissive member, the light-guiding adhesive member including a base material and organic particles dispersed in the base material;
a covering member disposed in contact with lateral surfaces of the light-transmissive member and in contact with the light-guiding adhesive member disposed on the lateral surfaces of the light emitting element;
an additional light emitting element, with the light emitting element and the additional light emitting element being aligned in a first direction; and
an additional light-transmissive member disposed on an upper surface of the additional light emitting element, wherein
the covering member includes at least one first covering portion disposed between the light-transmissive member and the additional light-transmissive member, and two second covering portions arranged at distal ends of the light emitting device in the first direction with the light-transmissive member and the additional light-transmissive member being arranged between the two second covering portions,
a first protrusion arranged on an upper surface of the first covering portion and being spaced apart from the light-transmissive member and the additional light-transmissive member, and
two second protrusions respectively arranged on upper surfaces of the two second covering portions.

21. The light emitting device according to claim 20, wherein
the organic particles have an average diameter in a range of 0.5 μm to 1.2 μm.

22. The light emitting device according to claim 20, wherein
the organic particles include 4 volume % or less of the organic particles having diameters of 2.5 μm or greater.

23. The light emitting device according to claim 20, wherein
the organic particles include 80 volume % or greater of the organic particles having diameters in a range of 0.3 μm to 2.0 μm.

24. The light emitting device according to claim 20, wherein
the organic particles have a refractive index that is 0.05 or greater in terms of absolute value than a refractive index of the base material of the light-guiding adhesive member.

25. The light emitting device according to claim 20, wherein
a content of the organic particles is in a range of 0.01 weight % to 2.0 weight %.

26. The light emitting device according to claim 20, wherein
the base material of the light-guiding adhesive member is a silicone resin having a refractive index in a range of 1.45 to 1.60, and the organic particles are made of a silicone resin that has a refractive index in a range of 1.35 to 1.55, and
an absolute value of a difference between the refractive index of the organic particles and the refractive index of the base material is 0.05 or greater.

* * * * *